US012672469B2

(12) United States Patent \
Yu et al.

(10) Patent No.: US 12,672,469 B2 \
(45) Date of Patent: Jun. 30, 2026

(54) LIGHT EMITTING DISPLAY DEVICE

(71) Applicant: LG Display Co., Ltd., Seoul (KR)

(72) Inventors: Hyeon-Hye Yu, Paju-si (KR); In-Goo Lee, Paju-si (KR); Won-Sik Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 443 days.

(21) Appl. No.: 18/488,312

(22) Filed: Oct. 17, 2023

(65) Prior Publication Data

US 2024/0260416 A1 Aug. 1, 2024

(30) Foreign Application Priority Data

Jan. 27, 2023 (KR) ........................ 10-2023-0010976

(51) Int. Cl. \
*H10K 59/80* (2023.01) \
*H10K 59/122* (2023.01)

(52) U.S. Cl. \
CPC ......... *H10K 59/878* (2023.02); *H10K 59/122* (2023.02)

(58) Field of Classification Search \
CPC ........................... H10K 59/878; H10K 59/122 \
USPC ................................................. 313/498–512 \
See application file for complete search history.

(56) References Cited

U.S. PATENT DOCUMENTS

| | | | |
|---|---|---|---|
| 10,008,555 B2 | 6/2018 | Yoo et al. | |
| 10,068,952 B2 | 9/2018 | Teramoto et al. | |
| 10,373,978 B2 | 8/2019 | Lee et al. | |
| 12,127,437 B2 * | 10/2024 | Kim ..................... | H10H 20/857 |
| 2018/0097195 A1 * | 4/2018 | Inoue ................... | H10K 59/124 |
| 2019/0067624 A1 | 2/2019 | Choi et al. | |
| 2020/0365776 A1 | 11/2020 | Sim et al. | |
| 2020/0373520 A1 | 11/2020 | Kim et al. | |
| 2021/0327970 A1 * | 10/2021 | Zhou ............... | H10K 59/80515 |
| 2022/0173358 A1 | 6/2022 | Hiraga | |
| 2024/0224748 A1 * | 7/2024 | Lee ...................... | H10K 59/878 |

OTHER PUBLICATIONS

Extended European search report dated Jun. 28, 2024 issued in Patent Application No. 23215792.5 (9 pages).

* cited by examiner

*Primary Examiner* — Christopher M Raabe \
(74) *Attorney, Agent, or Firm* — Fish & Richardson P.C.

(57) ABSTRACT

In one aspect, a light emitting display device includes a plurality of subpixels on a substrate, each of the plurality of subpixels having a corresponding emission region, each of the plurality of subpixels having an outer interface with an n-gonal shape; a light emitting diode at each corresponding emission region and including an emission layer; and a plurality of arc-shaped light reflectors inside the light emitting diode and having a lower refractive index than a refractive index of the emission layer. The plurality of arc-shaped light reflectors are in a quasi-caustic region of the outer interface.

20 Claims, 16 Drawing Sheets

FIG. 1 output

FIG. 5

QCAm

OR
(OR1)

QCAm

Lwg

Lr

QCAm

OR
(OR2)

OP

151

165(OD)

QCAm

IF

IFL

ORp1

ORp2

LIGHT EMITTING DISPLAY DEVICE

CROSS-REFERENCE TO RELATED APPLICATIONS

The present application claims the priority benefit of Korean Patent Application No. 10-2023-0010976 filed in Republic of Korea on Jan. 27, 2023, which is hereby incorporated by reference in its entirety for all purposes as if fully set forth herein.

BACKGROUND

Field of the Disclosure

The present disclosure relates to a light emitting display device.

Background

Recently, flat panel display devices having excellent characteristics such as thinness, light weight, and low power consumption have been widely developed and applied to various fields.

Among the flat panel display devices, a light emitting display device including a light emitting element such as a light emitting diode is a display device in which charges are injected into a light emitting layer formed between an anode and a cathode to form pairs of electrons and holes, and then the pairs disappear to emit light.

The light emitting display device does not have high light efficiency and thus needs to be improved.

SUMMARY

An advantageous aspect of the present disclosure is to provide a display device that may improve light efficiency.

In one aspect, a light emitting display device includes a plurality of subpixels on a substrate, each of the plurality of subpixels having a corresponding emission region, each of the plurality of subpixels having an outer interface with an n-gonal shape; a light emitting diode at each corresponding emission region and including an emission layer; and a plurality of arc-shaped light reflectors inside the light emitting diode and having a lower refractive index than a refractive index of the emission layer. The plurality of arc-shaped light reflectors are in a quasi-caustic region of the outer interface.

In another aspect, the light emitting display device is a top-emission device, and further includes a bank on the substrate having a corresponding opening for each of the plurality of subpixels.

In another aspect, at least a number of the arc-shaped light reflectors are disposed in a region having a highest total reflection optical path distribution in the quasi-caustic region.

In another aspect, a radius of a circle formed by the plurality of arc-shaped light reflectors is smaller than a radius of the emission region.

In another aspect, the plurality of arc-shaped light reflectors are positioned asymmetrically relative to each other in the mission region.

In another aspect, a height of each of the plurality of arc-shaped light reflectors is equal to or greater than a height of the emission layer.

In another aspect, a height of each of the plurality of arc-shaped light reflectors is smaller than a height of an inclined surface of each of the plurality of subpixels.

In another aspect, each of the plurality of arc-shaped light reflectors has a lower portion having a rectangular shape and an upper portion having a trapezoid shape.

In another aspect, a height of the rectangular portion is larger than a height of the trapezoid portion.

In one aspect, a light emitting display device includes a substrate; a transistor on the substrate; a subpixel electrically connected to the transistor, the subpixel including an organic light emitting diode; and a plurality of light reflectors inside the organic light emitting diode. The subpixel has an n-gonal shape and the plurality of light reflectors have an arc shape.

In another aspect, the subpixel has at least two emissions areas each having the n-gonal shape.

In another aspect, the subpixel has a rectangular shape. The plurality of light reflectors includes a first light reflector and a second light reflector staggered in a long axis direction of the rectangular shape, and a center of the first light reflector has different arc line than a center of the second light reflector.

In another aspect, the n-gonal shape has more than 5 sides, and at least a number of the plurality of light reflectors are in a quasi-caustic region of the subpixel.

In another aspect, the number of the plurality of light reflectors are in an area within the quasi-caustic region having a maximum distribution of total reflection optical path.

In another aspect, the light emitting display device further includes an inclined reflective portion within an emission area of the subpixel, wherein the inclined reflective portion has a shape corresponding to a shape of the subpixel.

In another aspect, the shape of the subpixel is one of a rectangular shape or a shape having more than 5 sides.

In another aspect, the inclined reflective portion extends from a first electrode of the subpixel.

In another aspect, the inclined reflective portion extends from a second electrode of the subpixel.

In another aspect, each of the plurality of light reflectors has a lower portion having a rectangular shape and an upper portion having a trapezoid shape.

In another aspect, a height of the rectangular portion is larger than a height of the trapezoid portion Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings:

FIG. 1 is a cross-sectional view schematically illustrating a light emitting display device according to some aspects of the present disclosure;

FIG. 5 is a view schematically illustrating an arrangement relationship between a light reflector and a quasi-caustic region and an extraction mechanism of a waveguide light according to some aspects of the present disclosure;

FIG. 6 is a cross-sectional view schematically illustrating an example of a cross-sectional structure of a light reflector according to some aspects of the present disclosure;

FIG. 12 is a view schematically illustrating an arrangement relationship between a light reflector and a whispering gallery mode region according to some aspects of the present disclosure;

FIG. 17 is a view schematically illustrating an arrangement relationship between a light reflector and a quasi-caustic region according to some aspects of the present disclosure;

FIG. 19 is a schematic cross-sectional view illustrating a cross-sectional structure of a light emitting display device according to some aspects of the present disclosure.

DETAILED DESCRIPTION

Figure 2:
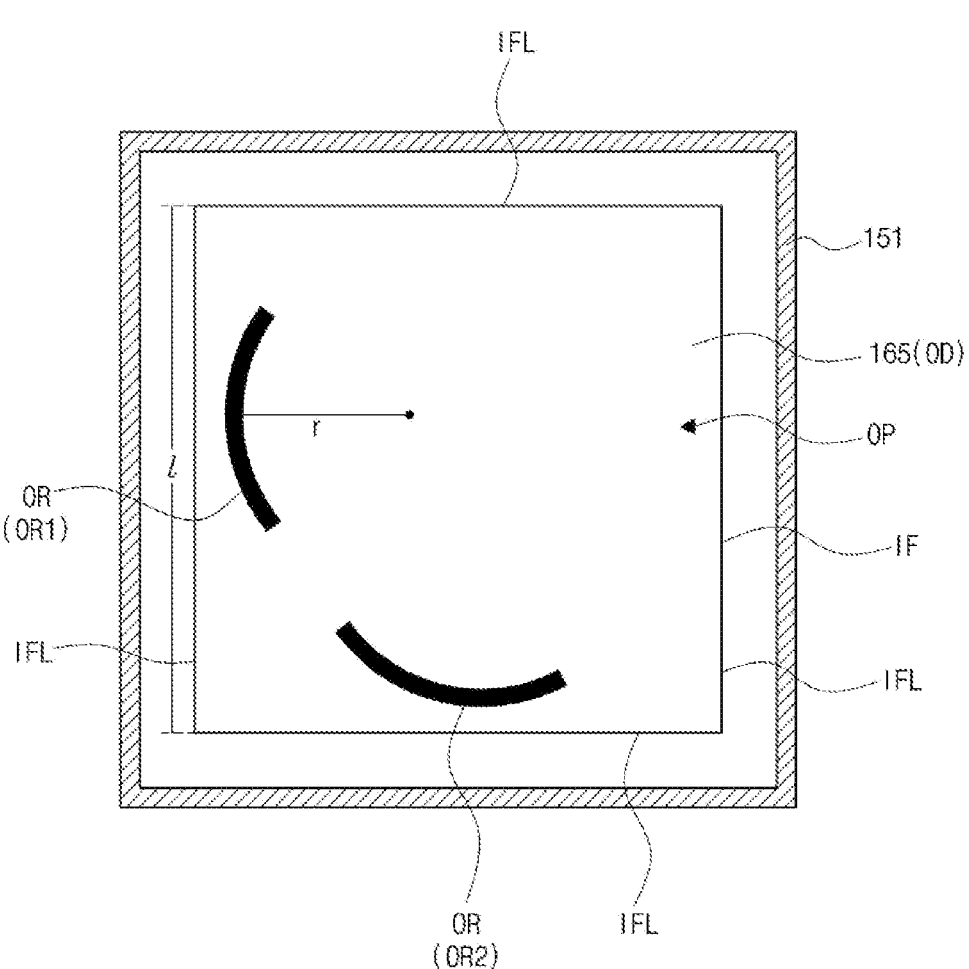
FIG. 2 is a plan view schematically illustrating a light extraction structure of a pixel region according to some aspects of the present disclosure.

Advantages and features of the present disclosure and methods of achieving them will be apparent with reference to the example embodiments described below in detail with the accompanying drawings. However, the present disclosure is not limited to the example embodiments disclosed below, but may be realized in a variety of different forms, and only these example embodiments allow the present disclosure to be complete. The present disclosure is provided to fully inform the scope of the disclosure to the skilled in the art of the present disclosure, and the present disclosure may be defined by the scope of the claims.

The shapes, sizes, proportions, angles, numbers, and the like disclosed in the drawings for explaining the example embodiments of the present disclosure are illustrative, and the present disclosure is not limited to the illustrated matters. The same reference numerals refer to the same components throughout the description.

Furthermore, in describing the present disclosure, if it is determined that a detailed description of the related known technology unnecessarily obscure the subject matter of the present disclosure, the detailed description thereof may be omitted. When 'comprising', 'including', 'having', 'consisting', and the like are used in this disclosure, other parts may be added unless 'only' is used. When a component is expressed in the singular, cases including the plural are included unless specific statement is described.

In interpreting the components, even if there is no separate explicit description, it is interpreted as including a margin range.

In the case of a description of a positional relationship, for example, when the positional relationship of two parts is described as 'on', 'over', 'above', 'below', 'beside', 'under', and the like, one or more other parts may be positioned between such two parts unless 'right' or 'directly' is used.

In the case of a description of a temporal relationship, for example, when a temporal precedence is described as 'after', 'following', 'before', and the like, cases that are not continuous may be included unless 'directly' or 'immediately' is used.

In describing components of the present disclosure, terms such as first, second and the like may be used. These terms are only for distinguishing the components from other components, and an essence, order, order, or number of the components is not limited by the terms.

Respective features of various example embodiments of the present disclosure may be partially or wholly connected to or combined with each other and may be technically interlocked and driven variously, and respective example embodiments may be independently implemented from each other or may be implemented together with a related relationship.

Hereinafter, example embodiments of the present disclosure are described in detail with reference to the drawings. Meanwhile, in the following example embodiments, the same and like reference numerals are assigned to the same and like components, and detailed descriptions thereof may be omitted.

<First Non-Limiting Aspect>

Figure 1:
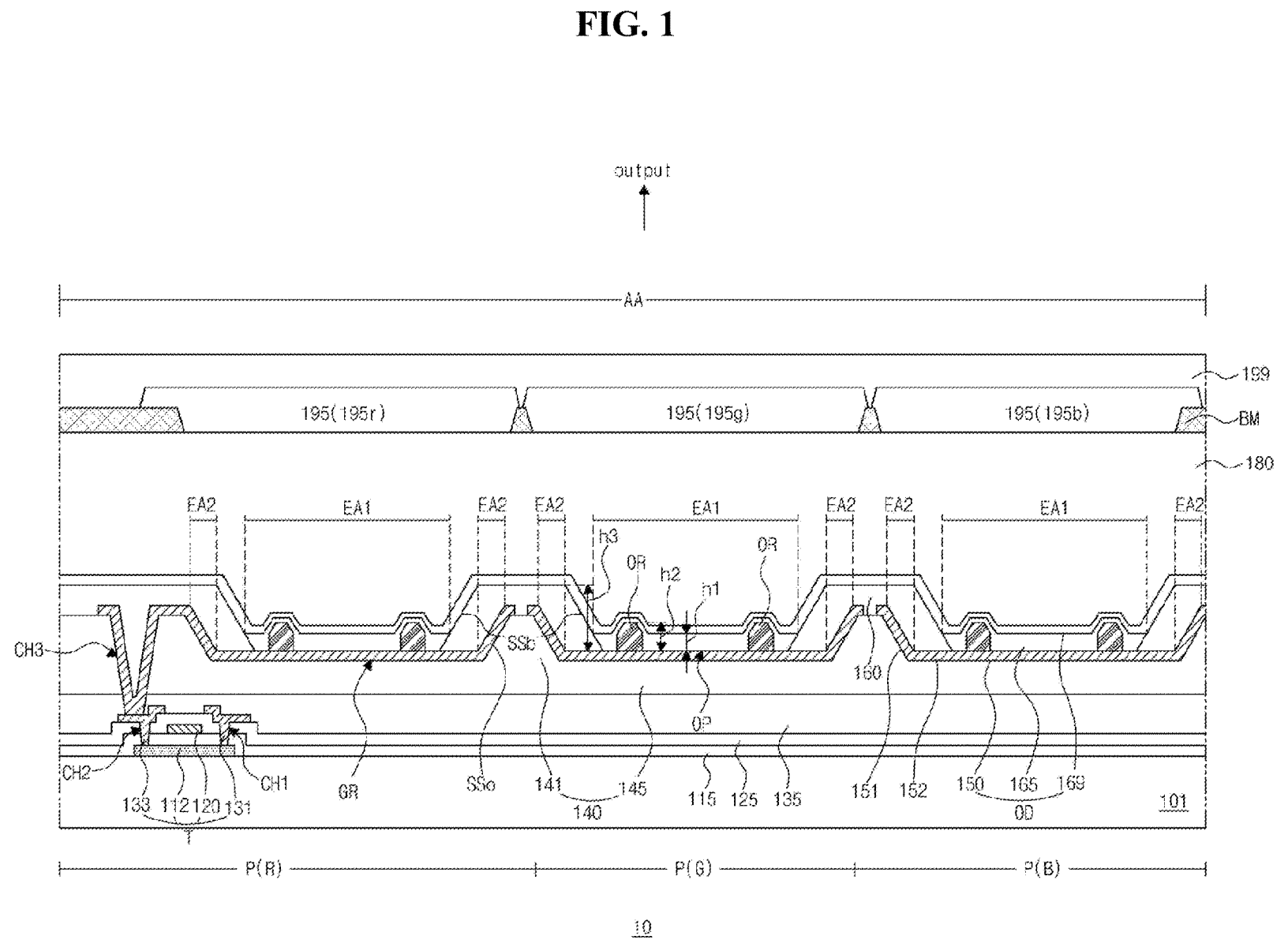

FIG. 1 is a cross-sectional view schematically illustrating a light emitting display device according to some aspects of the present disclosure. FIG. 2 is a plan view schematically illustrating a light extraction structure of a pixel region according to some aspects of the present disclosure.

Prior to a detailed description, the light emitting display device 10 according to the first aspect of the present disclosure may include all kinds of display devices including a light emitting diode (OD), which is a self-luminescent element, to display an image.

In this aspect, for convenience of description, an organic light emitting display device is taken as the light emitting display device 10 as an example.

Referring to FIG. 1, the light emitting display device 10 of this aspect may be a top emission type display device that displays an image by outputting light toward an upper side of a substrate 101.

On the substrate 101 of the light emitting display device 10, a plurality of pixel regions P may be arranged in a matrix form along a plurality of row lines and a plurality of column lines in a display region AA displaying an image. Meanwhile, although not shown in the drawings, a plurality of gate lines extending in a row direction and a plurality of data lines extending in a column direction may be formed on the substrate 101. Each pixel region P may be connected to corresponding gate line and data line.

The plurality of pixel regions P may include pixel regions of different colors constituting a unit pixel displaying a color image, for example, red (R), green (G), and blue (B) pixel regions P respectively displaying red (R), green (G), and blue (B).

In each pixel region P, a plurality of thin film transistors, at least one capacitor, and a light emitting diode OD may be formed on the substrate 101. Meanwhile, in FIG. 1, for convenience of description, one thin film transistor T, for example, a driving thin film transistor T disposed in the red (R) pixel region P is shown.

In more detail, a semiconductor layer 112 may be formed on an inner surface of the substrate 101. In this case, the semiconductor layer 112 may be made of amorphous silicon, polycrystalline silicon, or an oxide semiconductor material, but is not limited thereto.

The semiconductor layer 112 may include a central channel region and source and drain regions on both sides of the channel region.

A gate insulating layer 115 as an insulating layer made of an insulating material may be formed on the semiconductor layer 112. The gate insulating layer 115 may be formed of an inorganic insulating material such as silicon oxide or silicon nitride, but is not limited thereto.

A gate electrode 120 made of a conductive material such as metal may be formed on the gate insulating layer 115 to correspond to the channel region of the semiconductor layer 112.

In addition, a gate line connected to a gate electrode of a switching thin film transistor (not shown) may be formed on the gate insulating layer 115.

A first interlayered insulating layer 125 as an insulating layer made of an insulating material may be formed on the gate electrode 120 and over the entire surface of the substrate 101.

The first interlayered insulating layer 125 may be formed of an inorganic insulating material such as silicon oxide or silicon nitride, or may be formed of an organic insulating material such as benzocyclobutene or photo acryl, but is not limited thereto.

In the first interlayered insulating layer 125 and the gate insulating layer 115 below the first interlayer insulating layer 125, a first contact hole CH1 and a second contact hole CH2 respectively exposing the source region and the drain region of the semiconductor layer 112 may be provided.

The first contact hole CH1 and the second contact hole CH2 may be disposed on both sides of the gate electrode 120 and be spaced apart from the gate electrode 120.

A source electrode 131 and a drain electrode 133 made of a conductive material such as metal may be formed on the first interlayered insulating layer 125.

In addition, on the first interlayer insulating layer 125, a data line that crosses the gate line and is connected to the source electrode of the switching thin film transistor may be formed.

The source electrode 131 and the drain electrode 133 may be spaced apart from each other with the gate electrode 120 there between, and may contact the source region and the drain region of the semiconductor layer 112 through the first contact hole CH1 and the second contact hole CH2, respectively.

The semiconductor layer 112, the gate electrode 120, the source electrode 131, and the drain electrode 133, configured as above, may constitute the thin film transistor T.

As another example, the thin film transistor T may have an inverted staggered structure in which the gate electrode 120 is located below the semiconductor layer 112 and the source electrode 131 and the drain electrode 133 are located on the semiconductor layer 112.

A second interlayered insulating layer 135 as an insulating layer made of an insulating material may be formed on the source electrode 131 and the drain electrode 133 and over the entire surface of the substrate 101.

The second interlayered insulating layer 135 may be formed of an inorganic insulating material such as silicon oxide or silicon nitride, but is not limited thereto.

An overcoat layer (or planarization layer) 140 may be formed on the second interlayered insulating layer 135. The overcoat layer 140 may be formed of an organic insulating material such as benzocyclobutene or photo acryl, but is not limited thereto.

A third contact hole (or drain contact hole) CH3 exposing the drain electrode 133 may be formed in the overcoat layer 140 and the second interlayered insulating layer 135.

The overcoat layer 140 may include protruding portions (or separation walls) 141 protruding upward along a boundary (or edge) of each pixel region P. Accordingly, the overcoat layer 140 may be formed with concave grooves GR defined inside the protrusions 141 by the protrusions 141. Meanwhile, a portion of the overcoat layer 140 positioned below the concave groove GR (or below a bottom surface of the concave groove GR) may have a top surface (or upper surface) thereof which is substantially flat and be referred to as a flat portion (or base portion) 145.

The protruding portion 141 may be configured to have a tapered shape in which a width thereof narrows in an upward direction from which light is emitted. Accordingly, the protruding portion 141 may be configured with a side surface SSo thereof as an inclined surface SSo. In this regard, the inclined surface SSo of the protruding portion 141 may be configured to have a shape inclined at a certain angle in an outward direction based on the corresponding pixel region P. The inclined surface SSo may have a linear shape having a constant inclination angle or a protruding curved shape in which the inclination angle decreases from a lower end to a upper end. In this aspect, a case where the inclined surface SSo is linear is taken as an example.

The inclined surface SSo may surround the concave groove GR to define the concave groove GR. Accordingly, it may be seen that the concave groove GR has an inclined side surface (or outer circumferential surface) corresponding to the inclined surface SSo.

A first electrode (or anode) 150 may be formed on the overcoat layer 140 in each pixel region P.

The first electrode 150 of each pixel region P may be positioned to correspond to each concave groove GR of the overcoat layer 140, and may have a structure separated from the first electrode 150 of a neighboring pixel region P with the protruding portion 141 interposed therebetween. For example, neighboring first electrodes 150 may be spaced apart from each other on the upper surface of the protruding portion 141.

The first electrode 150 may include a metal material with high reflectance. For example, the first electrode 150 may include Al, Ag. Ti, or an Al—Pd—Cu (APC) alloy, but is not limited thereto.

Meanwhile, the first electrode 150 may have a single-layered structure or a multi-layered structure. When formed in a multi-layered structure, for example, the first electrode may have a laminated structure of Al and Ti (e.g., Ti/Al/Ti), a laminated structure of Al and ITO (e.g., ITO/Al/ITO), a laminated structure of an APC alloy and ITO (e.g., ITO/APC/ITO), etc., but is not limited thereto.

The first electrode 150 may include a reflective portion (or inclined portion) 151 formed along the inclined surface SSo of the overcoat layer 140. The reflective portion 151 may have a shape extending obliquely upward along the inclined surface SSo from the end of the portion of the first electrode 150 positioned on the flat portion 145 of the overcoat layer 140. The portion of the first electrode 150 positioned on the flat portion 145 of the overcoat layer 140 may be referred to as a flat portion (or base portion) 152 of the first electrode.

A bank 160 may be formed on the first electrode 150 to cover an edge of the first electrode. The bank 160 may be disposed along the boundary of the pixel region P, and may cover the edge portion including the reflective portion 151 of the first electrode 150 and cover the protruding portion 141 of the overcoat layer 140.

The bank 160 may be formed of, for example, at least one of acrylic resin, epoxy resin, phenol resin, polyamide resin, polyimide resin, unsaturated polyester resin, polyphenylene resin, polyphenylene sulfide resin, benzocyclobutene and photoresist, but is not limited thereto.

The bank 160 may have an opening OP therein exposing the first electrode 150 of each pixel region P.

The bank 160 may be formed in substantially the same shape as (or a shape corresponding to) the overcoat layer 140.

In this regard, the bank 160 may be configured to have a tapered shape with a width being narrower in an upward direction. The tapered shape of the bank 160 may be the same as that of the protruding portion 141 of the overcoat layer 140 positioned there below.

Accordingly, the bank 160 may be configured such that the side surface (or inner side surface) is an inclined surface SSb. The inclined surface SSb of the bank 160 may have substantially the same inclination angle as the inclined surface SSo of the protrusion 141 located there below.

The inclined surface SSb of the bank 160 may surround the opening OP. Accordingly, it may be seen that the opening OP has an inclined side surface (or outer circumferential surface) corresponding to the inclined surface SSb.

The opening OP may expose the flat portion 152 of the first electrode 150. More specifically, the bank 160 may be configured to cover the edge of the flat portion 152 of the first electrode 150, and the opening OP may expose a portion of the flat portion 152 except for the edge of the flat portion 152.

An emission layer 165 may be formed on the first electrode 150 of each pixel region P. The emission layer 165 may contact the first electrode 150 exposed through the opening OP of the bank 160.

The emission layer 165 may be formed separately in each pixel region P or may be formed continuously along the entire surface of the substrate 101 to correspond to all pixel regions P. In this aspect, for convenience of explanation, a case in which the emission layer 165 is formed in each pixel region P is taken as an example.

All of the emission layers 165 in respective pixel regions P may be formed of white emission layer emitting white light. As another example, the emission layer 165 of each pixel region P may be formed of an emission layer emitting the color of its pixel region P, for example, red (R), green (G), and blue (B) pixel regions P may respectively have red (R), green (G), and blue (B) emission layers.

The emission layer 165 may have a higher refractive index than the bank 160. For example, the emission layer 165 may have a refractive index (or first refractive index) of about 1.8 to 2.0, and the bank 160 may have a refractive index (or second refractive index) of about 1.5 to 1.6 lower than that of the emission layer 165, but are not limited thereto.

Due to this difference in refractive index, total reflection may occur for light traveling in a horizontal direction (or lateral direction) at an interface between the emission layer 165 and the bank 160.

A second electrode (or cathode) 169 may be formed on the emission layer 165 and over the entire surface of the substrate 101.

The second electrode 169 may be formed of a transparent electrode having a transparent property, and in this case, the second electrode 169 may be formed of a transparent conductive material such as ITO.

Meanwhile, in a case of realizing a micro cavity effect in a vertical direction, the second electrode 169 may be configured to include a semi-transparent electrode layer having a semi-transparent property, and may have a multi-layered structure including the semi-transparent electrode layer. The semi-transparent electrode layer of the second electrode 169 may be formed of, but not limited to, for example, a metal material such as magnesium (Mg), silver (Ag), or an alloy (MgAg) of magnesium (Mg) and silver (Ag), and such the metal material may be formed with a thickness thin enough to realize semi-transparent property.

The first electrode 150, the emission layer 165, and the second electrode 169 arranged as described above in the pixel region P may constitute the light emitting diode OD.

The light emitting diode OD may emit light from the emission layer 165 interposed between the first and second electrodes 150 and 169, and the emitted light may proceed upward and be output.

Meanwhile, some of the light generated from the emission layer 165 may propagate while being totally reflected in the lateral direction (or horizontal direction) of the pixel region P and may be trapped inside the display device. The so-called waveguide mode light traveling in the lateral direction may be reflected by the reflective portion 151 of the first electrode 150 disposed in the lateral direction of the light emitting diode OD and then emitted upward. As such, the reflective portion 151 of the first electrode 150 may function as a side mirror for reflecting light traveling in a lateral direction upward.

Due to the reflective portion 151 of the first electrode 150, light extraction efficiency of the light emitting display device 10 may be increased.

A region corresponding to the first electrode 150 exposed by the opening OP may be an effective (or substantial) emission region in which the light emitting diode OD is disposed to generate light, and this region may be referred to as a first emission region (or main emission region) EA1. Further, a region where the reflective portion 151 is disposed may be a so-called reflective emission region in which light generated in the emission layer 165 located inside the region and then propagated in the lateral direction is reflected and emitted upward, and this region may be referred to as a second emission region (or sub emission region EA2.

It may be seen that each pixel region P has an emission region including the first emission region EA1 and the second emission region EA2.

The first emission region EA1 may substantially correspond to a shape of the region corresponding to the first electrode 150 exposed through the opening OP, and the second emission region EA2 may have a shape that is at least partially spaced from the first emission region EA1 (e.g., the spaced region may be referred to as a non-emission region) and surrounds the second emission region EA2.

An encapsulation layer 180 may be formed on the second electrode 169. The encapsulation layer 180 may serve to prevent oxygen or moisture from permeating into the light emitting diode OD.

The encapsulation layer 180 may include, for example, at least one inorganic layer and at least one organic layer. Although not specifically shown, for example, the encapsulation layer 180 may have a structure in which a first inorganic layer, an organic layer on the first inorganic layer, and a second inorganic film on the organic layer are stacked.

A black matrix BM and a color filter layer 195 may be disposed on the encapsulation layer 180.

In this regard, the black matrix BM may be formed to correspond to an edge of each pixel region P.

The color filter layer 195 may be formed to correspond to each pixel region P. The color filter layer 195 may include red, green, and blue color filters (or color filter patterns) 195*r*. 195*g*, and 195*b* respectively corresponding to the red (R), green (G), and blue (B) pixel regions P.

By disposing the color filters 195*r*, 195*g*, and 195*b* in the corresponding pixel regions P, a color purity of light emitted from the corresponding pixel regions P may be improved.

An overcoat film 199 may be formed on the black matrix BM and the color filter layer 195 to cover and protect them. The substrate having the overcoat film 199 may have a substantially flat surface.

A mesh type touch electrode (not shown) may be disposed between the encapsulation layer 180 and the color filter layer 195. The touch electrode may be formed of electrode metal patterned in a mesh type. Accordingly, a plurality of opening regions may formed in a touch electrode region, and each opening region may correspond to each pixel region P.

In each opening region, the opening OP of the bank 160 of each pixel region P and the reflective portion 151 surrounding the opening OP may be positioned. At least two light reflectors OR may be disposed in the light emitting diode OD disposed in the opening OP. The mesh-type touch electrode may be arranged to overlap the black matrix BM but arranged not to overlap the opening OP and the reflective portion 151, thereby enabling a touch sensing and further increasing an aperture ratio and emission efficiency of the light emitting display device 10.

Meanwhile, in the light emitting display device 10 of this aspect configured as described above, the pixel region P may be formed in a polygonal shape (or n-gonal shape (n is a natural number of 4 or greater)) equal to or larger than a quadrangular shape in plan view.

In this aspect, a case in which the pixel region P is formed of a quadrangular shape, more specifically, a square structure is taken as an example.

In this regard, for example, the opening OP and the light emitting diode OD disposed therein may be formed in a square shape in plain view. In addition, the reflective portion 151 surrounding the opening OP and the light emitting diode OD may also be formed in a square shape in plain view as a shape corresponding to the opening OP and the light emitting diode OD. More specifically, the reflective portion 151 may have a square band shape in plan view.

As such, when the pixel region P is formed in a square structure, due to its morphological characteristics, a waveguide light as light traveling in a horizontal direction may exist that is totally reflected at an interface IF between the emission layer 165 and the bank 160 (or its inclined surface SSb), more specifically, at linear portions IFL of the interface IF, and propagates in the horizontal direction. This waveguide light may be lengthened in path due to total reflection, thus may be absorbed by the medium and be dissipated, and thus an amount of light reaching the reflective portion 151 may be reduced.

Moreover, according to the morphological characteristics of the square structure, a path (or trajectory) of the waveguide light is regularly (or stably) distributed (or formed) within the emission layer 165.

In this aspect, to maximize light efficiency by reducing the path of waveguide light reflected on the linear interface IF between the square emission layer 165 and the bank 160, a light reflector (or refracting reflector or total reflector) OR having an arc shape (or curved shape) in plan view may be formed in the light emitting diode OD (or in the opening OP of the bank 160).

As such, the arc-shaped light reflector OR destroys the regular light path of the guide light in the emission layer 165 and disperses (or scatters) the light path, so that the arc-shaped light reflector OR may sharply change the regular light path of the waveguide light and cause an unstable (or irregular or chaotic) state. As the path of the waveguide light is changed to become unstable in this way, the path of the waveguide light is reduced and the amount of light absorbed by the medium is reduced, so that the amount of light reaching the reflective portion 151 is increased, and as a result, the light extraction efficiency may be maximized.

A light extraction structure in which the arc-shaped light reflector OR is applied to the square pixel region P (or light emitting diode OD) is described in detail below.

Referring to FIGS. 1 and 2, in the light emitting display device 10 of this aspect, a plurality of light reflectors OR may be formed inside the light emitting diode OD. Meanwhile, in this aspect, a case in which two light reflectors OR are disposed inside the light emitting diode OD is taken as an example.

The light reflector OR may be formed between the first electrode 150 and the light emitting layer 165 in the opening OP.

In this regard, for example, the light reflector OR may be formed such that its lower surface (or bottom surface)

contacts the upper surface (or top surface) of the first electrode 150, and its upper surface (or its top surface) and its side surface contact the emission layer 165.

In other words, the light reflector OR may be formed to protrude upward from the first electrode 150 and be covered (or wrapped) by the emission layer 165.

The light reflector OR may be formed of the same material and in the same process as the bank 160. In this case, there is no need to perform a separate process to form the light reflector OR, so that process efficiency may be improved.

As another example, the light reflector OR may be formed in a process different from that of the bank 160, and in this case, the light reflector OR may be formed of the same material as the bank 160 or a different material from the bank 160.

Meanwhile, the light reflector OR may have a refractive index (or third refractive index) lower than that of the emission layer 165 and may have a refractive index equal to or lower than that of the bank 160. For example, the light reflector OR may have a refractive index of about 1.5 to 1.6, but is not limited thereto.

Due to a difference in refractive index between the emission layer 165 and the light reflector OR, light having a critical angle of total reflection or higher may be reflected at an interface between the emission layer 165 and the light reflector OR.

As such, by forming the light reflector OR to have a lower refractive index than the emission layer 165, light reflection by total reflection is achieved on the surface of the light reflector OR (or the interface between the light reflector OR and the emission layer 165), so that the light reflector OR may reflect the waveguide light in the horizontal direction within the emission layer 165 to change its path.

Meanwhile, to sharply change the path of the waveguide light in the horizontal direction and improve light efficiency, the light reflector OR may be formed with the arc shape in plan view, as mentioned above.

In this regard, the total reflection interface IF of the light emitting diode OD (i.e., the side surface SSb of the bank 160), which is the total reflection interface (or first total reflection interface) IF between the emission layer 165 and the bank 160, is formed linearly. In other words, since the total reflection interface IF has a square structure including four equal-length linear portions IFL, it is considered that the total reflection interface IF is configured linearly.

Similarly, if the light reflector OR is formed in a linear shape in plan view, the waveguide light is reflected along a total reflection interface (or second total reflection interface) between the linear light reflector OR and the emission layer 165, thus a path of the waveguide light becomes longer, and thus a light extraction efficiency may not be improved but rather deteriorated.

On the other hand, in this aspect, the light reflector OR is formed in the arc shape different from the linear shape of the total reflection interface IF of the light emitting diode OD.

Accordingly, the path of the waveguide light reflected by the linear total reflection interface IF is sharply changed by the total reflection interface of the arc-shaped light reflector OR which has a different shape from the linear total reflection interface IF, so that the incident angle of light to the total reflection interface IF of the light emitting diode OD is changed sharply under the critical angle of total reflection. Accordingly, the light extraction efficiency of the waveguide light may be maximized.

As such, in this aspect, the light reflector OR implementing the arc-shaped total reflection interface different from the linear total reflection interface is formed inside the light emitting diode OD forming the linear total reflection interface IF with the bank 160.

As such, in the light emitting diode OD, as an optically simulated structure of a sinai billiard structure in which a square boundary surface and a circular boundary surface inside the square boundary surface are combined and which is one of chaotic dynamics billiard structures, a chaotic dynamics structure may be implemented in which the linear total reflection interface IF and the arc-shaped total reflection interface inside the linear total reflection interface IF are combined to make a motion trajectory of light in a chaotic state.

Accordingly, by destroying the regular path of the waveguide light along the linear total reflection interface and dispersing the light path, the path of the waveguide light may be made unstable. Therefore, since the path of the waveguide light is sharply changed to reduce the length of the path, so that the amount of light absorbed by the medium may be minimized and the amount of light reaching the reflective portion 151 may be maximized and thus light extraction efficiency may be maximized.

Meanwhile, to destroy the path of the waveguide light on the linear total reflection interface IF, it is preferable that the light reflector OR is disposed to cross (or block) the total reflection path of the waveguide light formed inside the total reflection interface IF. More specifically, it is preferable that at least a portion of the light reflector OR is disposed in a region where the total reflection path is substantially highest (or most) distributed inside the total reflection interface IF.

Figure 3:
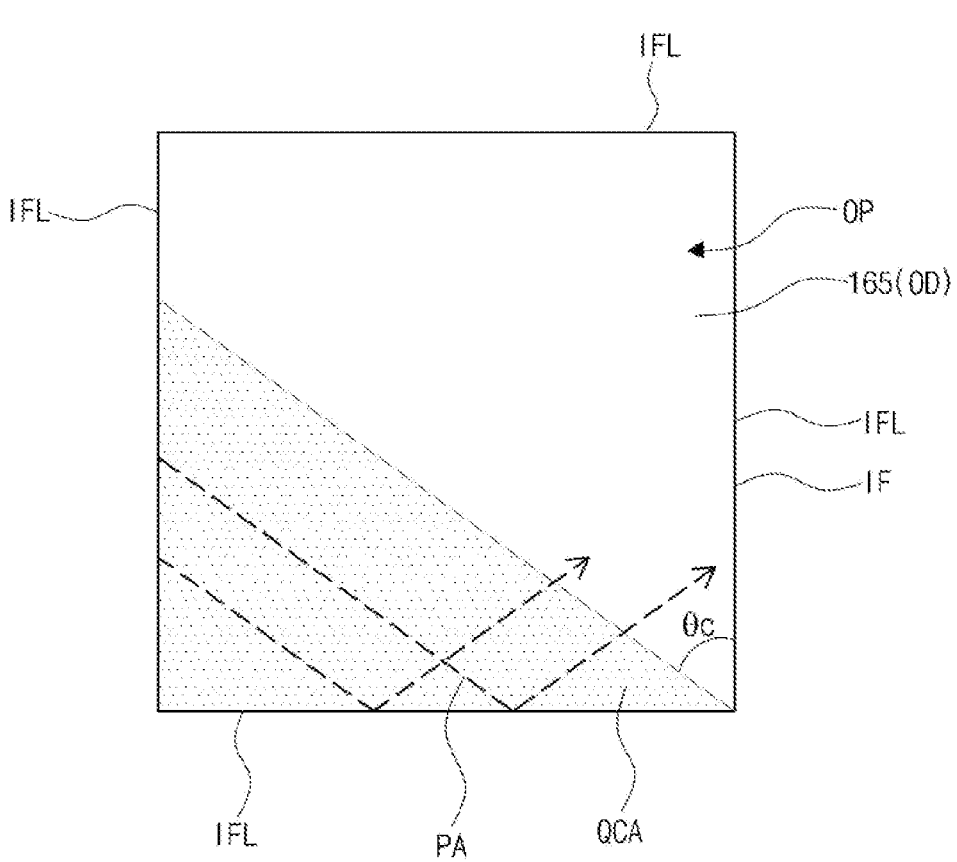
FIG. 3 is a view schematically illustrating a total reflection path of a waveguide light of a light emitting diode according to some aspects of the present disclosure.
Figure 4:
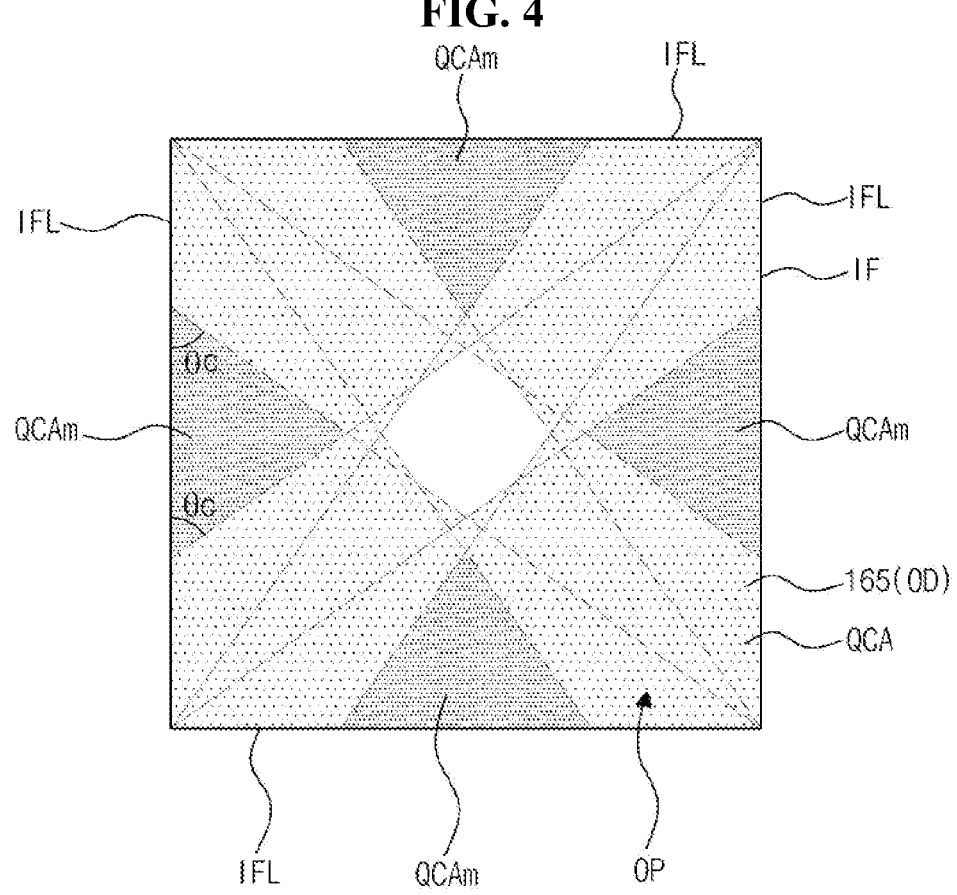
FIG. 4 is a view schematically illustrating a quasi-caustic region in which a total reflection path of a waveguide light of a light emitting diode exists according to some aspects of the present disclosure.
Figures 5, 6:
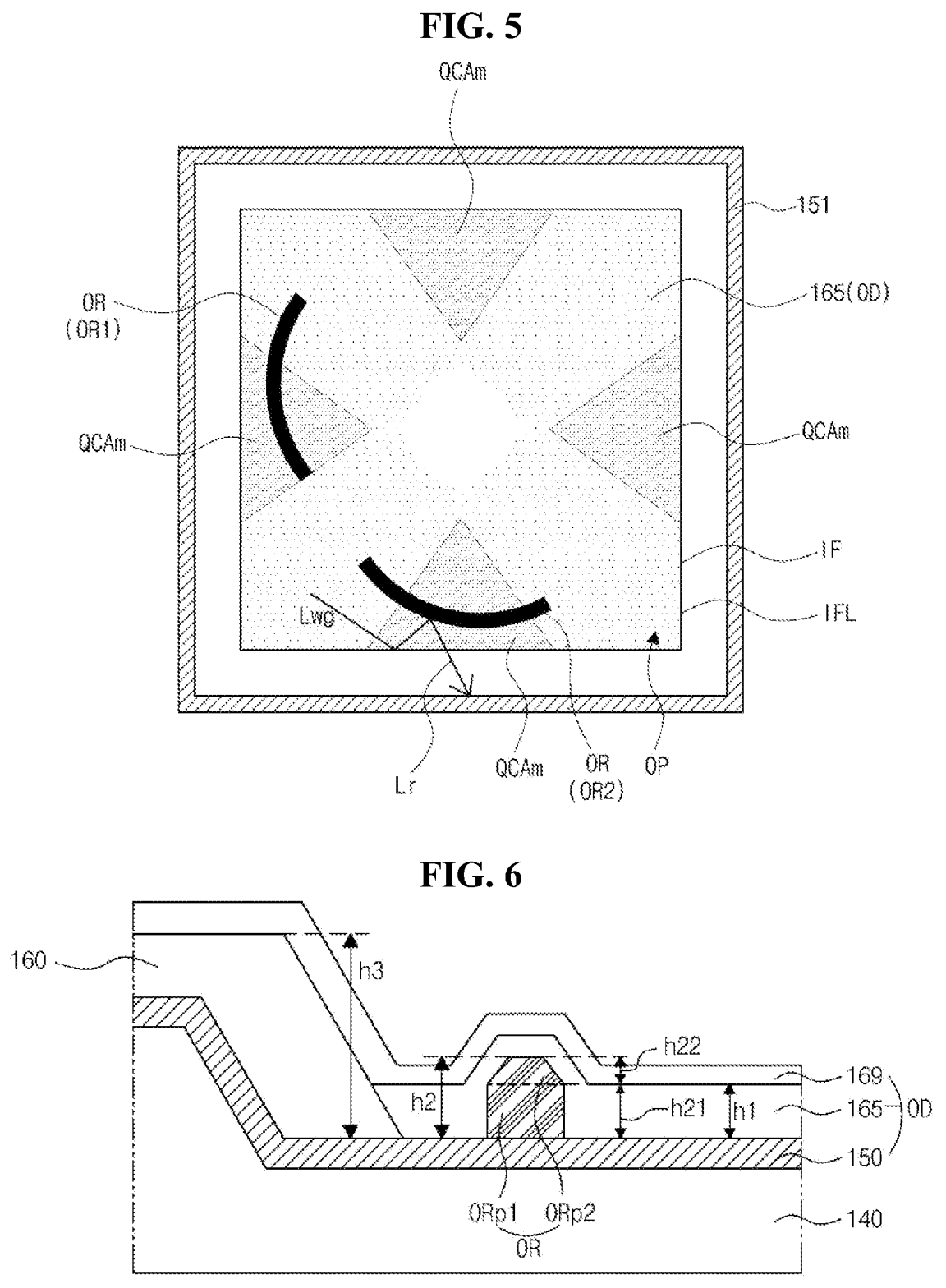

This is described with further reference to FIGS. 3 to 5.

FIG. 3 is a view schematically illustrating a total reflection path of a waveguide light of a light emitting diode according to some aspects of the present disclosure. FIG. 4 is a view schematically illustrating a quasi-caustic region in which a total reflection path of a waveguide light of a light emitting diode exists according to some aspects of the present disclosure. FIG. 5 is a view schematically illustrating an arrangement relationship between a light reflector and a quasi-caustic region and an extraction mechanism of a waveguide light according to some aspects of the present disclosure.

As shown in FIG. 3, light in the horizontal direction is totally reflected when it is incident on the linear portion IFL of the total reflection interface IF of the light emitting diode OD at a total reflection critical angle θc or more. In FIG. 3, for convenience of description, a path PA of light which is incident on and is totally reflected on the linear portion IFL located at a lower side of the total reflection interface IF from a left part of the light emitting diode OD is shown as an example.

As such, since the interface IF is formed in a linear shape, a quasi-caustic region QCA, which is a total reflection optical path region having a right-angled triangular shape based on the lower linear portion IFL, may be made.

In this regard, for a circular (or elliptical) total reflection interface, a waveguide light of a whispering gallery mode, which is trapped inside the interface while rotating in a stable path along the circular total reflection interface inside the interface, exists, and a total reflection optical path region in which the paths of the waveguide light are uniformly distributed is called a caustic region. In this aspect, the total reflection interface IF has a quadrangular structure and is formed to have the linear portion IFL, and due to this morphological characteristics, the waveguide light is not confined inside the total reflection interface IF, but is totally reflected according to the total reflection critical angle θc and then passes through the total reflection interface IF, and the total reflection light paths PA are regularly distributed.

Thus, based on (or compared with) the caustic region by the circular total reflection interface, in this aspect, the region where the total reflection optical paths exists may be defined as a quasi-caustic region QCA.

The quasi-caustic region QCA shown in FIG. 3 may be formed in the same form for each of other linear portions IFL (i.e., left, right, and upper linear portions), and by combining the quasi-caustic regions QCA formed by all the linear portions IFL, the quasi-caustic regions QCA of the form shown in FIG. 4 may be made.

Referring to FIG. 4, except for a partial region in the middle of the light emitting diode OD (i.e., a region without a total reflection optical path), the remaining region becomes the quasi-caustic region QCA. The total reflection optical path regions formed by respective linear portions IFL overlap. For example, a region where the total reflection optical paths formed by two neighboring linear portions IFL overlap each other, and a region where the total reflection optical paths formed by three neighboring linear portions IFL overlap each other overlap each other exist.

Here, a region in which the total reflection optical path distribution is highest due to overlapping total reflection optical paths is referred to as a maximum quasi-caustic region QCAm.

As such, the maximum quasi-caustic region QCAm corresponds to a region in which an amount of total reflection waveguide light is substantially greatest.

The maximum quasi-caustic region QCAm may be defined inside each linear portion IFL, and may have an isosceles triangle shape in which a base is substantially in contact with the corresponding linear portion IFL and a base angle is a critical angle θc for total reflection.

Reflecting this quasi-caustic region QCA, as shown in FIG. 5, the arc-shaped light reflector OR of this aspect may be arranged to be located in the quasi-caustic region QCA, more specifically, the maximum quasi-caustic region QCAm. Meanwhile, in FIG. 5, for convenience of description, a case in which a portion of the light reflector OR is positioned within the maximum quasi-caustic region QCAm is shown as an example. As another example, the entire light reflector OR may be disposed within the maximum quasi-caustic region QCAm. As such, at least a portion of the light reflector OR may be positioned within the maximum quasi-caustic region QCAm.

Here, as shown in FIG. 5, when a portion of the light reflector OR is disposed in the maximum quasi-caustic region QCAm, the remaining portion of the light reflector OR may be disposed in the quasi-caustic region QCA different from the maximum quasi-caustic region QCAm.

As described above, in this aspect, the light reflector OR may be disposed in the quasi-caustic region QCA, and at least a portion of the light reflector OR may be disposed in the maximum quasi-caustic region QCAm.

Furthermore, the light reflector OR may be arranged such that a convex direction of the arc of the light reflector OR is directed toward the linear portion IFL of the total reflection interface IF adjacent to the light reflector OR. In other words, the light reflector OR may be arranged such that an outer surface of the arc is directed toward the linear portion IFL adjacent thereto.

As the arc-shaped light reflector OR is configured as described above, the waveguide light Lwg within the maximum quasi-caustic region QCAm is reflected by the arc-shaped light reflector OR, and the path thereof may be sharply changed.

The reflected light Lr whose light path is sharply changed in this way passes through the linear portion IFL of the total reflection interface IF adjacent to the light reflector OR, then reaches and is reflected by a portion of the reflective portion 151 (or the linear portion of the reflective portion 151) adjacent to the linear part IFL, and then proceeds toward the top of the light emitting display device 10 to be output to the outside.

As such, by arranging the light reflector OR in the quasi-caustic region QCA, more specifically, arranging at least a portion of the light reflector OR in the maximum quasi-caustic area QCAm, the waveguide light Lwg may be sharply changed in trajectory to reach the nearest reflective portion 151 on its path, so that the light path may be substantially minimized. Accordingly, an amount of light absorbed by the medium may be minimized and an amount of light reaching the reflective portion 151 may be maximized.

Moreover, since the light reflector OR may be located in the maximum quasi-caustic region QCAm, a maximum of the waveguide light Lwg may reach the reflective portion 151 and may be extracted.

Accordingly, according to this aspect, by using the arc-shaped light reflector OR, the light extraction efficiency may be maximized.

Meanwhile, in this aspect, as mentioned above, the plurality of light reflectors OR may be disposed in the light emitting diode OD, and the plurality of light reflectors OR may be configured such that their orientation directions (or azimuth directions), for example, normal directions at centers of their arcs (or their arc lines) are different from each other.

In this regard, referring to FIGS. 2 and 5, for example, first and second light reflectors OR1 and OR2 disposed at different positions as the plurality of light reflectors OR may be provided in the light emitting diode OD.

The normal direction (or first normal direction) at the center of the arc of the first light reflector OR1 and the normal direction (or second normal direction) at the center of the arc of the second light reflector OR2 may not be parallel to each other but may be different. In other words, the normal direction of the arc of the first light reflector OR1 and the normal direction of the arc of the second light reflector OR2 may not coincide with each other but may be different.

As such, as the orientation directions of the light reflectors OR1 and OR2 disposed in the light emitting diode OD are configured differently from each other, asymmetry of the light reflectors OR1 and OR2 may be increased. Accordingly, light is reflected between the light reflectors OR1 and OR2 to prevent a light path from being lengthened, thereby preventing light loss due to the lengthening of the light path. In addition, as the asymmetry of the light reflectors OR1 and OR2 increases, the chaotic characteristics of the waveguide light increase, so that the light extraction efficiency may be increased.

Meanwhile, it is preferable that the arc-shaped light reflector OR has a sufficient curvature to implement a dispersion (or scattering) action for the waveguide light.

In this regard, referring to FIG. 2, for example, a radius r of the arc-shaped light reflector OR may be less than half of a length 1 of the linear portion IFL which corresponds to one side of the total reflection interface IF of the square light emitting diode OD.

In this case, assuming that the light reflector OR is formed in a circular shape having the radius r, the circular light reflector OR may be included inside the square light emitting diode OD (or emission region). As such, the structure in which the circular light reflector OR is disposed in the square total reflection interface IF corresponds to the aforementioned sinai billiard structure with chaotic dynamics.

To realize a simulated structure of the sinai billiard structure, the arc-shaped light reflector OR of this aspect may be formed such that the radius r is less than half of the length l of the linear portion IF.

Meanwhile, referring to FIG. 1, the light reflector OR of this aspect may have a height (or thickness) h2 (or a second height) equal to or greater than a height (or thickness) h1 (or first height) of the emission layer 165 which is located around the light reflector OR. In other words, the upper surface (or top) of the light reflector OR may have the height h2 equal to or greater than the height h1 of an upper surface of a portion of the emission layer 165 located around the light reflector OR (i.e., a portion of the emission layer 165 which is located in a flat shape on the first electrode 150 without covering the light reflector OR). It may have a height h2 equal to or greater than the height h1 of the upper surface of the light emitting layer 165. More preferably, the light reflector OR may be formed to have the height h2 greater than that of the emission layer 165.

In this regard, if the light reflector OR has a height lower than that of the emission layer 165, a waveguide light traveling in the horizontal direction may not be incident on and reflected by the light reflector OR but may pass over the light reflector OR.

To prevent this, the light reflector OR may be configured to have the height h2 equal to or greater than the height h1 of the emission layer 165.

Furthermore, the light reflector OR may be formed to have the height h2 lower than a height (or thickness) h3 (or third height) of the bank 160. In other words, the upper surface of the light reflector OR may be formed to have the height h2 smaller than the upper surface of the bank 160. According to this configuration, it is possible to secure step coverage characteristics on the light reflector OR with respect to the second electrode 169.

An example of a cross-sectional structure of the light reflector OR is described in more detail with reference to FIG. 6.

FIG. 6 is a cross-sectional view schematically illustrating an example of a cross-sectional structure of a light reflector according to some aspects of the present disclosure.

Referring to FIGS. 1 and 6, the light reflector OR of this aspect may include a first portion ORp1 as a lower portion and a second portion ORp2 as an upper portion.

A side surface of the first portion ORp1 may have a very steep inclination angle, for example, an inclination angle of about 80 degrees to 90 degrees, but is not limited thereto. A height (or thickness) h21 (or first partial height) of the first portion ORp1 may be equal to or greater than the height (or thickness) h1 of the emission layer 165 around the light reflector OR.

By configuring the first portion ORp1 having the height h21 higher than that of the emission layer 165, light traveling in the horizontal direction passes through the light reflector OR is totally reflected by the light reflector OR according to an incident angle while maintaining a substantially horizontal direction.

The second part ORp2 on the first part ORp1 may have a side surface which has a smaller inclination angle than the first part ORp1, for example, has an inclination angle of about 40 degrees to 50 degrees, but is limited thereto. The inclination angle of the side surface of the second portion ORp2 may be equal to or smaller than that of the side surface SSb of the bank 160.

By configuring the second portion ORp2 having a relatively low inclination angle, deterioration in step coverage characteristics of the second electrode 169 which is formed along the upper portion of the light reflector OR may be prevented.

A height h22 of the second portion ORp2 may be formed equal to or less than the height h21 of the first portion ORp1 in consideration of the step coverage characteristics of the second electrode 169, but is not limited thereto.

Meanwhile, in this aspect, as mentioned above, the light reflector OR made of an insulating material having a lower refractive index than the emission layer 165 and causing a total reflection action is used, and this may realize a higher light extraction efficiency than a case where a light reflector is formed of a metal material with high reflective property.

In this regard, for example, in a case that the light reflector is formed of a metal material of the first electrode 150, a significant amount of the waveguide light traveling in the horizontal direction, for example, about 50% is reflected between the first electrode 150 and the second electrode 169 and waveguided, and thus is not extracted to the outside but is absorbed into the medium and disappear.

Therefore, as in this aspect, as the light reflector OR is formed of a material with a low refractive index, it is advantageous to reduce loss of the waveguide light and maximize light extraction efficiency.

<Second Non-Limiting Aspect>

Figure 7:
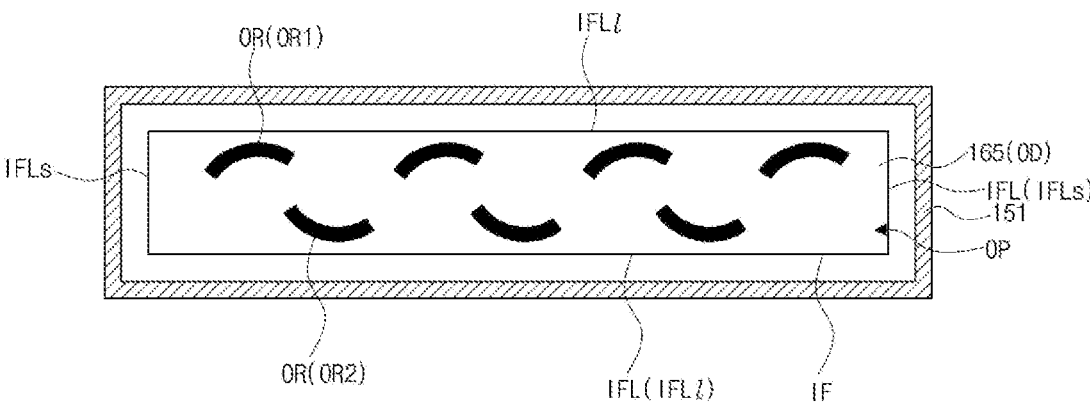
FIG. 7 is a plan view schematically illustrating a light extraction structure of a pixel region of a light emitting display device according to some aspects of the present disclosure.

FIG. 7 is a plan view schematically illustrating a light extraction structure of a pixel region of a light emitting display device according to some aspects of the present disclosure.

In the following description, detailed explanations of components identical or similar to those of the first aspect described above may be omitted.

Referring to FIG. 7, unlike the first aspect, the pixel region P of this aspect may have a rectangular structure.

In this regard, for example, the opening OP and the light emitting diode OD disposed therein may be formed in a rectangular shape in plan view. Also, the reflective portion 151 surrounding the opening OP and the light emitting diode OD may have a rectangular shape in plan view which is a shape corresponding to the opening OP and the light emitting diode OD. More specifically, the reflective portion 151 may have a rectangular band shape in plan view.

Accordingly, the interface IF between the emission layer 165 of the rectangular light emitting diode OD and the bank (160 of FIG. 1) may include four linear portions IFL forming a rectangle, for example, two long side linear portions (or first linear portions) IFL1 extending in the long axis direction (or long side direction) and two short side linear portions (or second linear portions) IFLs extending in the short axis direction (or short side direction).

In this way, when the pixel region P is formed in a rectangular structure, due to its morphological characteristics, a waveguide light as light traveling in the horizontal direction may exist that is totally reflected at the interface IF between the emission layer 165 and the bank, more specifically, at linear portions IFL the interface IF one or more times, and propagates in the horizontal direction. This waveguide light may be lengthened in path by total reflection along the long side linear portions IFL1, thus may be absorbed by the medium and be dissipated, and thus an amount of light reaching the reflective portion 151 may be reduced.

Furthermore, according to the morphological characteristics of the rectangular structure, the path of the waveguide light is regularly (or stably) distributed within the emission layer 165.

In this regard, in this aspect, to maximize light efficiency by reducing the path of the waveguide light reflected on the linear interface IF between the rectangular emission layer 165 and the bank, the light reflector OR having the arc shape in plan view may be formed in the light emitting diode OD.

Accordingly, similar to the first aspect described above, the arc-shaped light reflector OR destroys the regular light path of the waveguide light in the emission layer 165 to disperse (or scatter) the light path. Thus, the path of the waveguide light is reduced, thus an amount of light absorbed by the medium is reduced, and thus an amount of light reaching the reflective portion 151 is increased, and as a result, the light extraction efficiency may be maximized.

A light extraction structure in which the arc-shaped light reflector OR is applied to the rectangular pixel region P (or light emitting diode OD) is described in detail below.

In the light emitting display device of this aspect, the plurality of arc-shaped light reflectors OR may be formed inside the light emitting diode OD. Meanwhile, in this aspect, a case in which seven light reflectors OR are disposed inside the light emitting diode OD is taken as an example.

As such, in this aspect, the light reflector OR realizing the arc-shaped total reflection interface different from the linear total reflection interface is formed inside the light emitting diode OD forming the linear total reflection interface IF with the bank, so that a simulated structure of a sinai billiard structure with chaotic dynamics may be implemented and thus the light extraction efficiency may be maximized.

To destroy the path of the waveguide light reflected along the total reflection interface IF, the light reflector OR is preferably arranged to cross the total reflection path of the waveguide light. More specifically, it is preferable that the light reflector OR is disposed in a region where the total reflection path is substantially most distributed inside the total reflection interface IF.

Figure 8:
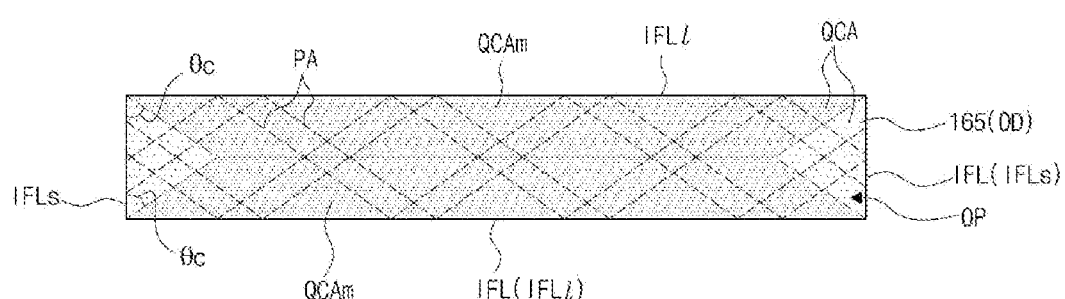
FIG. 8 is a view schematically illustrating a quasi-caustic region in which a total reflection path of a waveguide light of a light emitting diode exists according to some aspects of the present disclosure.
Figure 9:
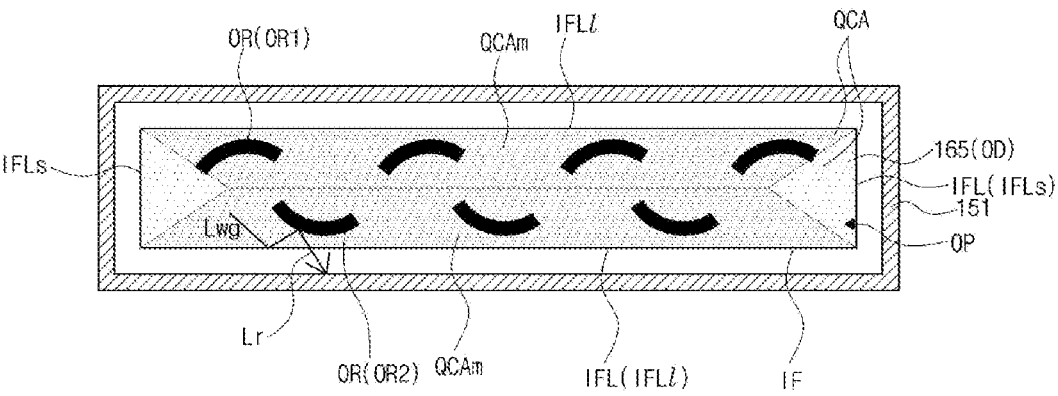
FIG. 9 is a view schematically illustrating an arrangement relationship between a light reflector and a quasi-caustic region and an extraction mechanism of a waveguide light according to some aspects of the present disclosure.

This is described with further reference to FIGS. 8 and 9.

FIG. 8 is a view schematically illustrating a quasi-caustic region in which a total reflection path of a waveguide light of a light emitting diode exists according to some aspects of the present disclosure. FIG. 9 is a view schematically illustrating an arrangement relationship between a light reflector and a quasi-caustic region and an extraction mechanism of a waveguide light according to some aspects of the present disclosure.

As shown in FIG. 8, as the light emitting diode OD is formed in a rectangular shape, the path PA of the waveguide light that is totally reflected may be substantially formed along the long axis direction.

In this regard, the waveguide light in the horizontal direction may propagate while being totally reflected between two long side linear portions IFL1 which extend in the long axis direction and face each other.

Accordingly, the quasi-caustic region QCA, which is a total reflection optical path region, may be formed substantially throughout the inner region of the light emitting diode OD.

In addition, according to the morphological characteristics of the rectangle, the maximum quasi-caustic region QCAm, which is a region in which the total reflection optical paths PA overlap and are highest distributed, may be defined between the two long side linear portions IFL1.

In this regard, the total reflection light path PA has a shape that proceeds along the long axis direction while alternately reflecting between two long side linear portions IFL1.

By this total reflection optical path PA, the isosceles triangular region inside each of the two short side linear portions IFLs may become the quasi-caustic region QCA in which the total reflection optical paths do not substantially overlap and a total reflection optical path distribution is low; the trapezoidal region inside each of the two long side linear portions IFL1 may become the maximum quasi-caustic region QCAm in which the total reflection optical paths overlap and a total reflection optical path distribution is high.

Here, the quasi-caustic area QCA in the form of the isosceles triangle inside each short side linear portion IFLs may have an isosceles shape in which a base is substantially in contact with the short side linear portion IFL and a base angle is the critical angle θc of total reflection.

Further, the maximum quasi-caustic region QCAm in the form of the trapezoid inside each long side linear portion IFL1 may have an isosceles trapezoidal shape in which a lower side is substantially in contact with the long side linear portion IFL1 and both lower angles of the lower side are 90−θc, and an upper side is substantially positioned on the central line along the long axis direction inside the light emitting diode OD.

As a result, the maximum quasi-caustic region QCAm formed inside the light emitting diode OD may correspond to a region in which the two trapezoidal regions inside the two long side linear portions IFL1 are combined.

Reflecting this quasi-caustic region QCA, as shown in FIG. 9, the arc-shaped light reflector OR of this aspect may be arranged to be located in the quasi-caustic region QCA, more specifically, the maximum quasi-caustic region QCAm. Meanwhile, in FIG. 9, for convenience of description, a case in which each light reflector OR is positioned within the maximum quasi-caustic region QCAm is shown as an example. As another example, at least a portion of the light reflector OR located adjacent to the short side may be disposed within the maximum quasi-caustic region QCAm.

Further, the light reflector OR may be arranged such that the convex direction of the arc of the light reflector OR is directed to the long side linear portion IFL1 of the total reflection interface IF adjacent to the light reflector OR.

As the arc-shaped light reflector OR is configured as described above, the waveguide light Lwg within the maximum quasi-caustic region QCAm is reflected by the arc-shaped light reflector OR, and the path thereof may be sharply changed.

The reflected light Lr whose light path has changed abruptly in this way passes through the long side linear portion IFL1 of the total reflection interface IF adjacent to the light reflector OR, then reaches and is reflected by a portion of the reflective portion 151 adjacent to the linear portion IFL1, and then proceeds toward the top of the light emitting display device to be output to the outside.

As described above, according to this aspect, by using the arc-shaped light reflector OR, the light extraction efficiency may be maximized.

Meanwhile, in this aspect, as mentioned above, the plurality of light reflectors OR may be disposed in the light emitting diode OD, and the plurality of light reflectors OR may be configured such that their orientation directions, for example, normal directions at centers of their arcs are different from each other.

In this regard, referring to FIGS. 7 and 9, for example, as the plurality of light reflectors OR, the first light reflector OR1 adjacent to the upper long side linear portion (or first long side linear portion) IFL1, and the second light reflector OR2 adjacent to the lower long side linear portion (or second long side linear portion) IFL1 may be alternately arranged while being staggered with each other along the long axis direction.

The normal direction (or first normal direction) at the center of the arc of the first light reflector OR1 and the normal direction (or second normal direction) at the center of the arc of the second light reflector OR2 may not be parallel to each other but may be different. In other words, the normal direction of the arc of the first light reflector OR1 and the normal direction of the arc of the second light reflector OR2 may not coincide with each other but may be different.

Accordingly, light is reflected between the light reflectors OR1 and OR2 to prevent a light path from being lengthened, thereby preventing light loss due to the lengthening of the light path. In addition, as the asymmetry of the light reflectors OR1 and OR2 increases, the chaotic characteristics of the waveguide light increase, so that the light extraction efficiency may be increased.

Meanwhile, similar to the above-described first aspect, it is preferable that the arc-shaped light reflector OR has a sufficient curvature to implement a dispersion (or scattering) action for the waveguide light.

In this regard, the radius of the arc-shaped light reflector OR may be less than half of the length of the short side linear portion IFLs of the total reflection interface IF of the rectangular light emitting diode OD.

Accordingly, a simulated structure of a sinai billiard structure with chaotic dynamics may be implemented.

<Third Non-Limiting Aspect>

Figure 10:
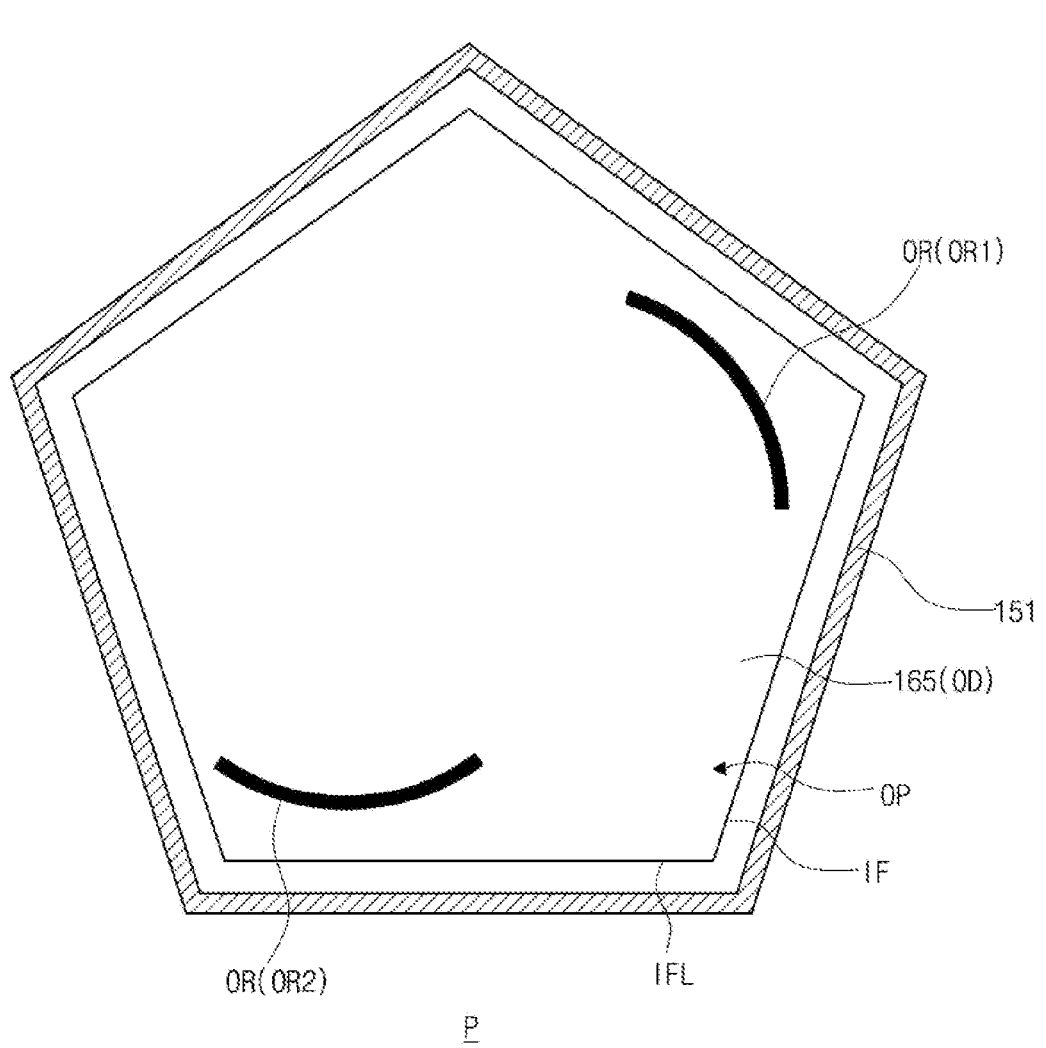
FIG. 10 is a plan view schematically illustrating a light extraction structure of a pixel region of a light emitting display device according to some aspects of the present disclosure.

FIG. 10 is a plan view schematically illustrating a light extraction structure of a pixel region of a light emitting display device according to some aspects of the present disclosure.

In the following description, detailed explanations of components identical or similar to those of the first and second embodiments may be omitted.

Referring to FIG. 10, unlike the first and second embodiments, the pixel region P of this aspect may have a regular pentagonal structure.

In this regard, for example, the opening OP and the light emitting diodes OD disposed therein may be formed in a regular pentagonal shape in plan view. Also, the reflective portion 151 surrounding the opening OP and the light emitting diode OD may have a regular pentagonal shape in plan view which is a shape corresponding to the opening OP and the light emitting diode OD. More specifically, the reflective portion 151 may have a regular pentagonal band shape in plan view.

Accordingly, the interface IF between the emission layer 165 of the regular pentagonal light emitting diode OD and the bank (160 of FIG. 1) may have five linear portions IFL forming a regular pentagon.

As such, when the pixel region P is formed in a regular pentagonal structure, due to its morphological characteristics, a waveguide light as light traveling in the horizontal direction may exist that is totally reflected at the interface IF between the emission layer 165 and the bank, more specifically, at linear portions IFL the interface IF one or more times, and propagates in the horizontal direction. This waveguide light may be lengthened in path by total reflection, thus may be absorbed by the medium and be dissipated, and thus an amount of light reaching the reflective portion 151 may be reduced.

Moreover, according to the morphological characteristics of the regular pentagonal structure, the path of the waveguide light is regularly (or stably) distributed within the emission layer 165.

In addition, in the regular pentagonal structure, a whispering gallery mode light may exist that is a waveguide light which is continuously totally reflected along the interface IF between the emission layer 165 and the bank to generate stable (or regular) light path (or light trajectory) inside the interface IF and thus trapped in the emission layer 165 without being output to an outside of the interface IF, and this waveguide light may be absorbed by a medium and dissipated.

In this regard, in this aspect, to maximize light efficiency by reducing the path of the waveguide light reflected on the linear interface IF between the regular pentagonal emission layer 165 and the bank and by extracting the waveguide light of the whispering Gallery mode to the outside of the interface IF, the light reflector OR having the arc shape in plan view may be formed in the light emitting diode OD.

Accordingly, similar to the above-described first and second embodiments, the arc-shaped light reflector OR destroys the regular light path of the waveguide light in the emission layer 165 to disperse (or scatter) the light path. Thus, the path of the waveguide light is reduced and the amount of light absorbed by the medium is reduced, so that the amount of light reaching the reflective portion 151 may be increased. In addition, for the whispering gallery mode waveguide light, the incident angle of the waveguide light is sharply changed to less than the critical angle of total reflection of the linear interface IF and passes through the linear interface IF and thus may be extracted to the reflective portion 151, so that the light extraction efficiency may be maximized.

A light extraction structure in which the arc-shaped light reflector OR is applied to the regular pentagonal pixel region P (or light emitting diode OD) is described in detail below.

In the light emitting display device of this aspect, the plurality of arc-shaped light reflectors OR may be formed inside the light emitting diode OD. Meanwhile, in this aspect, a case in which two light reflectors OR are disposed inside the light emitting diode OD is taken as an example.

As such, in this aspect, by forming the light reflector OR realizing the arc-shaped total reflection interface different from the linear total reflection interface inside the light emitting diode OD forming the linear total reflection interface IF with the bank, so that a simulated structure of a sinai billiard structure with chaotic dynamics may be implemented and thus the light extraction efficiency may be maximized.

It is preferable that the light reflector OR is disposed in a quasi-caustic region, more specifically, at least a portion of the light reflector OR is disposed in a maximum quasi-caustic region. In addition, it is preferable that the light reflector OR is disposed in a whispering gallery mode region which is a region in which waveguide light rotating in the whispering gallery mode is distributed.

Figure 11:
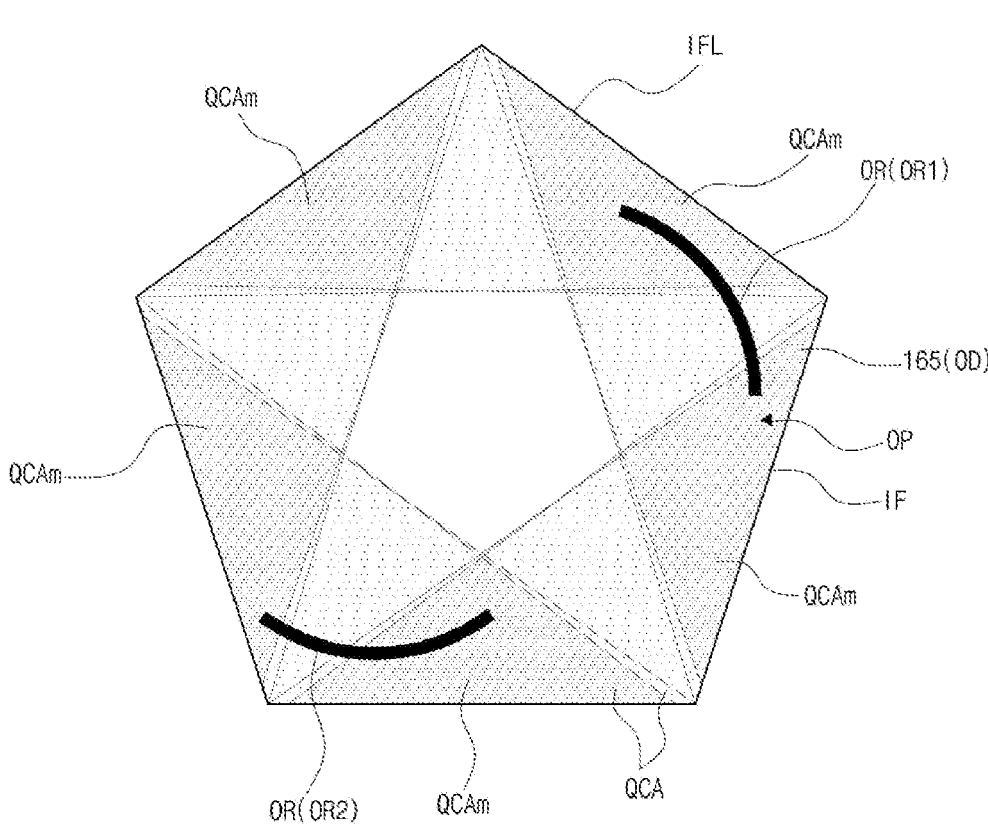
FIG. 11 is a view schematically illustrating an arrangement relationship between a light reflector and a quasi-caustic region according to some aspects of the present disclosure.
Figure 12:
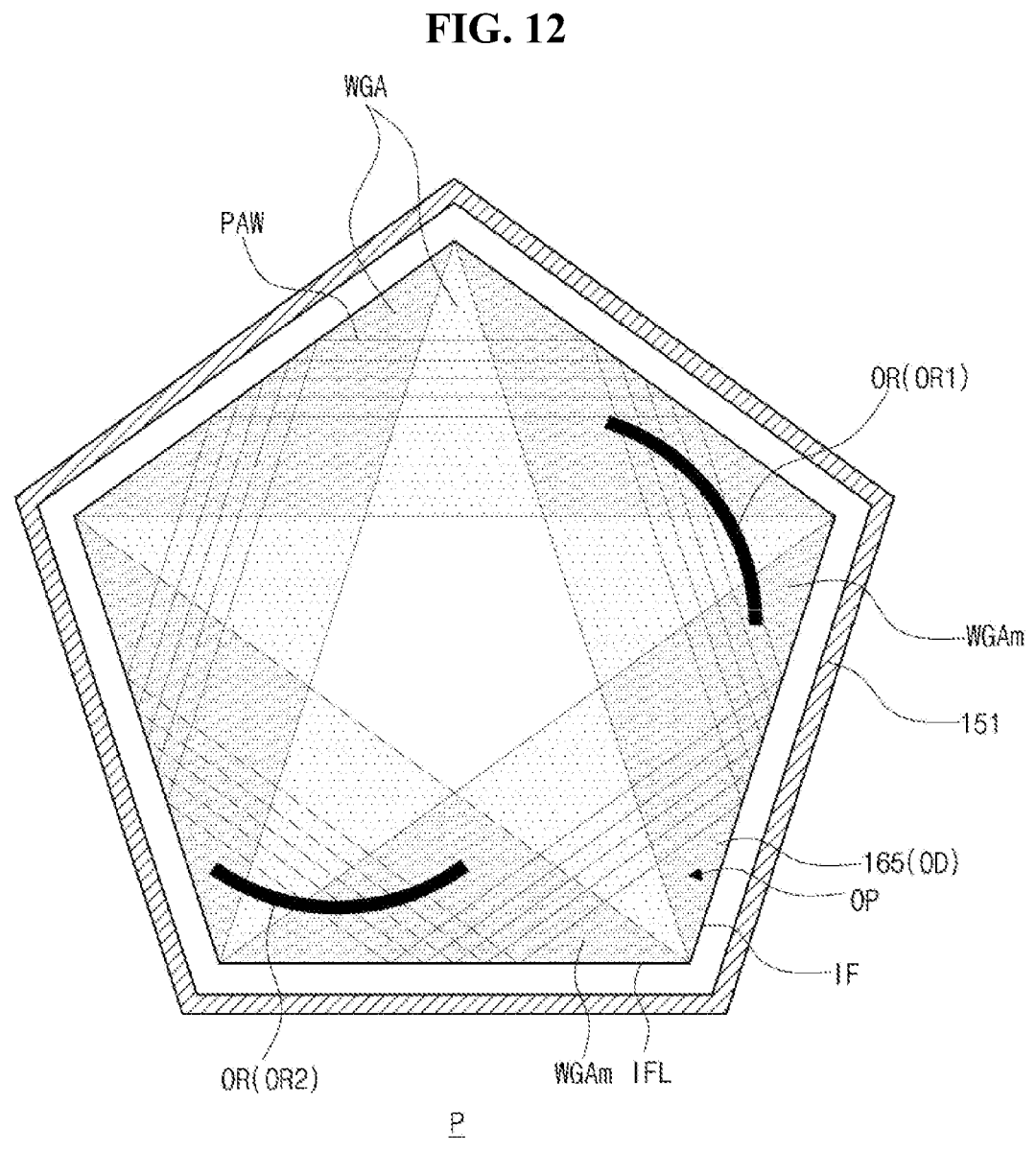

This is described with further reference to FIGS. 11 and 12.

FIG. 11 is a view schematically illustrating an arrangement relationship between a light reflector and a quasi-caustic region according to some aspects of the present disclosure. FIG. 12 is a view schematically illustrating an arrangement relationship between a light reflector and a whispering gallery mode region according to some aspects of the present disclosure.

As shown in FIG. 11, as the light emitting diode OD is formed in a regular pentagonal shape, similar to the case of the square structure of the first aspect, the quasi-caustic region QCA may be formed inside the light emitting diode OD.

In this regard, by combining the total reflection optical path regions formed by respective linear portions IFL of the total reflection interface IF of the regular pentagonal light emitting diode OD, except for a partial region in the middle of the light emitting diode OD, the remaining region becomes the quasi-caustic region QCA.

Here, the maximum quasi-caustic region QCAm with the largest amount of total reflection waveguide light may be defined inside each linear portion IFL, and may have an isosceles triangle shape in which a base is substantially in contact with the corresponding linear portion IFL.

Reflecting the quasi-caustic region QCA, at least a portion of the arc-shaped light reflector OR of this aspect may be arranged to be located in the maximum quasi-caustic area QCAm.

Furthermore, as shown in FIG. 12, since the light emitting diode OD is formed in the regular pentagonal shape, as mentioned above, the waveguide light of the whispering gallery mode may be generated.

In this regard, for example, the waveguide light which is incident on and totally reflected by the linear portion IFL at an angle equal to half the interior angle of the regular pentagon may has a regular pentagonal total reflection path PAW that continuously rotates along the total reflection interface IF, and may be trapped inside and dissipated.

The total reflection waveguide light of the whispering gallery mode corresponds to a part of the waveguide light forming the above-described quasi-caustic region QCA.

Accordingly, the whispering gallery mode region WGA, in which the path of the guide light of the whispering gallery mode is distributed, may be formed similarly to the quasi-caustic region QCA of FIG. 11.

In this regard, the whispering gallery mode region WGA may be located substantially within the quasi-caustic region QCA.

Here, the maximum whispering gallery mode region WGAm, in which the amount of total reflection waveguide light of the whispering gallery mode is greatest, may be defined inside each linear portion IFL, and may have an isosceles triangle shape in which a base is substantially in contact with the corresponding linear portion IFL.

Reflecting the whispering gallery mode region WGA, at least a portion of the arc-shaped light reflectors OR of this aspect may be arranged to be located in the maximum whispering gallery mode region WGAm.

Here, the maximum whispering gallery mode region WGAm and the maximum quasi-caustic region QCAm may be formed to mostly overlap each other except for some edges.

Thus, it may be seen that when the light reflector OR is located in the maximum quasi-caustic region QCAm, it is also substantially located in the maximum whispering gallery mode region WGAm.

As such, when the light reflector OR may be disposed in the whispering gallery mode region WGA, the waveguide light trapped inside the light emitting diode OD may be extracted to the outside, and light efficiency may be maximized.

Meanwhile, the light reflector OR may be arranged such that the convex direction of the arc of the light reflector OR is directed to the linear portion IFL of the total reflection interface IF adjacent to the light reflector OR.

Further, the plurality of light reflectors OR may be configured such that their orientation directions, for example, normal directions at centers of their arcs are different from each other. For example, the normal direction of the arc of the first light reflector OR1 and the second arc, and the normal direction of the arc of the second light reflector OR2 may not coincide with each other and may be different.

Meanwhile, similar to the above-described first and second embodiments, it is preferable that the arc-shaped light reflector OR has a sufficient curvature to implement a dispersion (or scattering) action for the waveguide light.

In this regard, the radius of the arc-shaped light reflector OR may have a size such that a circle having the radius is included inside the light emitting diode OD (or emission region).

<Fourth Non-Limiting Aspect>

Figure 13:
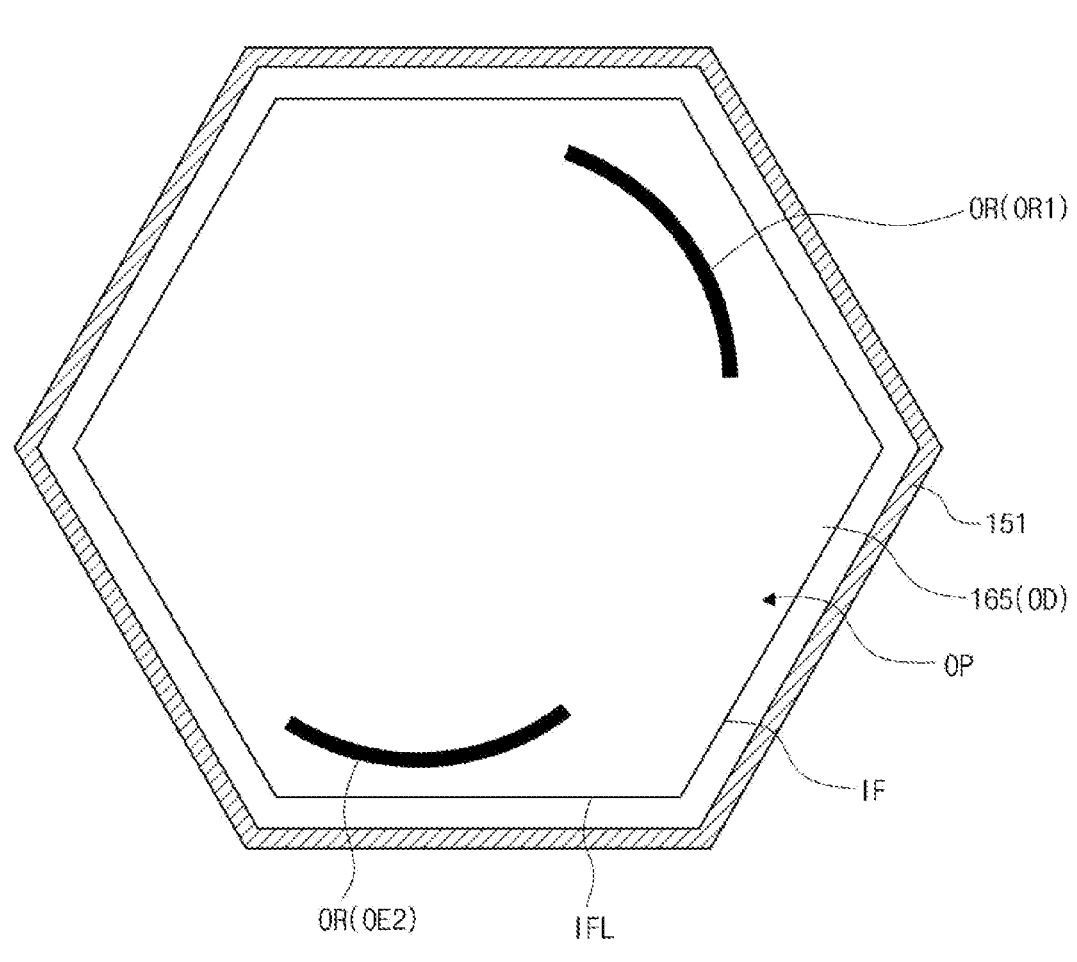
FIG. 13 is a plan view schematically illustrating a light extraction structure of a pixel region of a light emitting display device according to some aspects of the present disclosure.

FIG. 13 is a plan view schematically illustrating a light extraction structure of a pixel region of a light emitting display device according to some aspects of the present disclosure.

In the following description, detailed descriptions of components identical or similar to those of the first to third embodiments may be omitted.

Referring to FIG. 13, unlike the first to third embodiments, the pixel region P of this aspect may have a regular hexagonal structure.

In this regard, for example, the opening OP and the light emitting diodes OD disposed therein may be formed in a regular hexagonal shape in plan view. Also, the reflective portion 151 surrounding the opening OP and the light emitting diode OD may also have a regular hexagonal shape in plan view which is a shape corresponding to the opening OP and the light emitting diode OD. More specifically, the reflective portion 151 may have a regular hexagonal band shape in plan view.

Accordingly, the interface IF between the emission layer 165 of the regular hexagonal light emitting diode OD and the bank (160 of FIG. 1) may have six linear portions IFL forming a regular hexagon.

As such, when the pixel region P is formed in a regular hexagonal structure, due to its morphological characteristics, a waveguide light as light traveling in the horizontal direction may exist that is totally reflected at the interface IF between the emission layer 165 and the bank, more specifically, at linear portions IFL the interface IF one or more times, and propagates in the horizontal direction. This waveguide light may be lengthened in path by total reflection, thus may be absorbed by the medium and be dissipated, and thus an amount of light reaching the reflective portion 151 may be reduced.

Moreover, according to the morphological characteristics of the regular hexagonal structure, the path of the guided light is regularly (or stably) distributed within the emission layer 165.

In addition, in the regular hexagonal structure, similar to the third aspect described above, a whispering gallery mode light may exist that is a waveguide light which is continuously totally reflected along the interface IF between the emission layer 165 and the bank to generate stable (or regular) light path (or light trajectory) inside the interface IF and thus trapped in the emission layer 165 without being output to an outside of the interface IF, and this waveguide light may be absorbed by a medium and dissipated.

In this regard, in this aspect, to maximize light efficiency by reducing the path of the waveguide light reflected on the linear interface IF between the regular hexagonal emission layer 165 and the bank and by extracting the waveguide light of the whispering Gallery mode to the outside of the interface IF, the light reflector OR having the arc shape in plan view may be formed in the light emitting diode OD.

Accordingly, similar to the above-described first to third embodiments, the arc-shaped light reflector OR destroys the regular light path of the waveguide light in the emission layer 165 to disperse (or scatter) the light path. Thus, the path of the waveguide light is reduced and the amount of light absorbed by the medium is reduced, so that the amount of light reaching the reflective portion 151 may be increased. In addition, the whispering gallery mode waveguide light may be extracted toward the reflective portion 151. As a result, the light extraction efficiency may be maximized.

A light extraction structure in which the arc-shaped light reflector OR is applied to the regular hexagonal pixel region P (or light emitting diode OD) is described in detail below.

In the light emitting display device of this aspect, the plurality of arc-shaped light reflectors OR may be formed inside the light emitting diode OD. Meanwhile, in this aspect, a case in which two light reflectors OR are disposed inside the light emitting diode (OD) is taken as an example.

As such, in this aspect, by forming the light reflector OR realizing the arc-shaped total reflection interface different from the linear total reflection interface IF inside the light emitting diode OD forming the linear total reflection interface IF with the bank, so that a simulated structure of a sinai billiard structure with chaotic dynamics may be implemented and thus the light extraction efficiency may be maximized.

It is preferable that the light reflector OR is disposed in a quasi-caustic region, more specifically, at least a portion of the light reflector OR is disposed in a maximum quasi-caustic region. In addition, it is preferable that the light reflector OR is disposed in a whispering gallery mode region which is a region in which waveguide light rotating in the whispering gallery mode is distributed.

Figure 14:
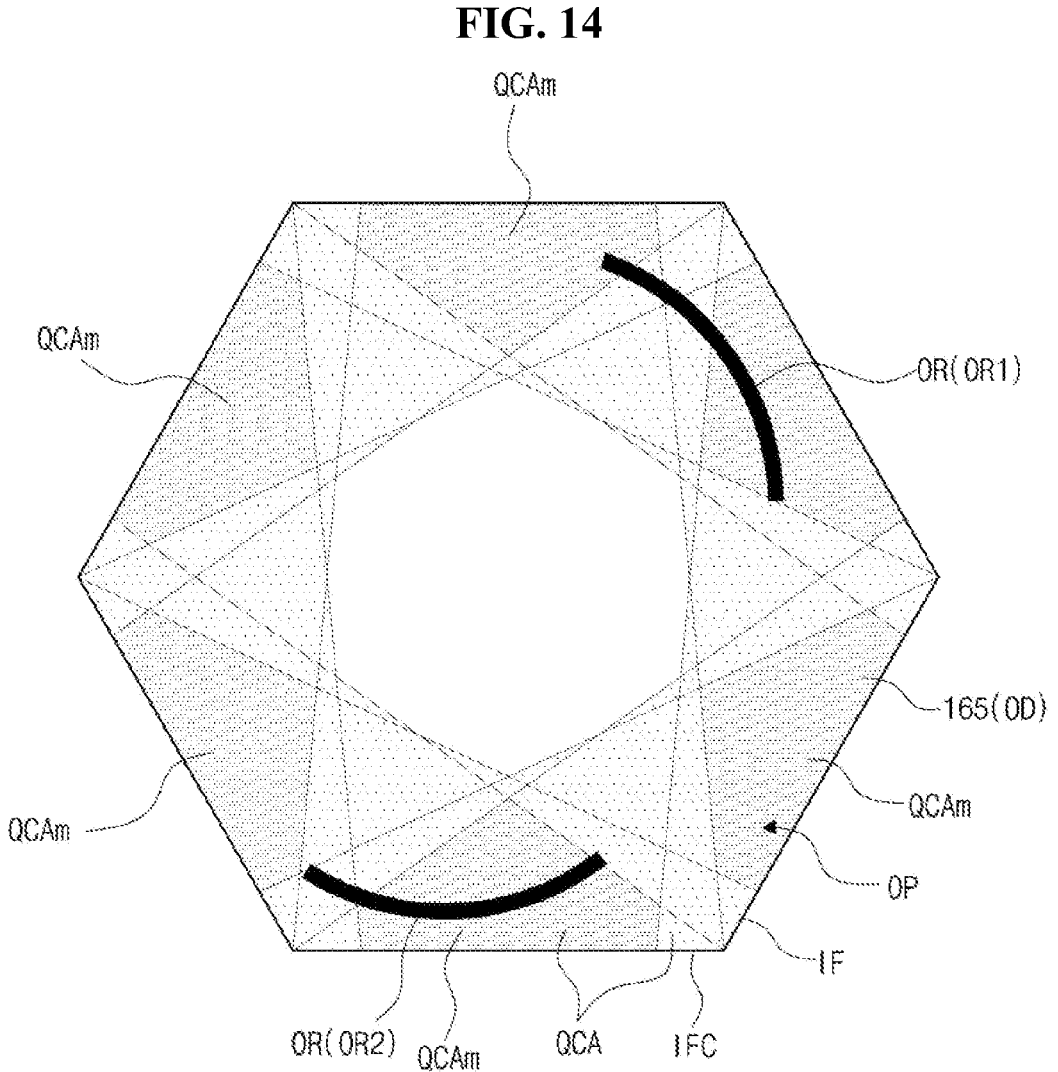
FIG. 14 is a view schematically illustrating an arrangement relationship between a light reflector and a quasi-caustic region according to some aspects of the present disclosure.
Figure 15:
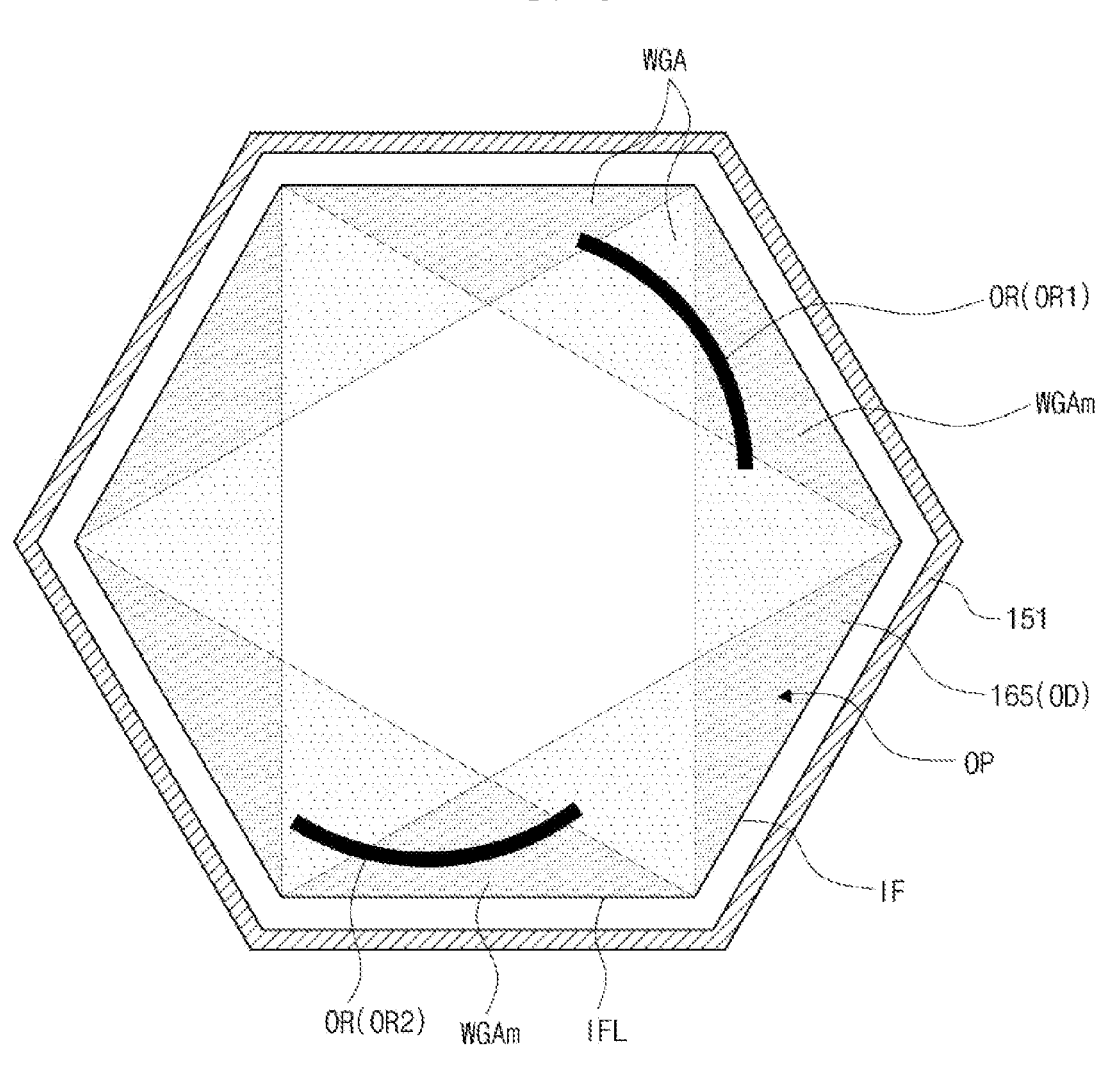
FIG. 15 is a view schematically illustrating an arrangement relationship between a light reflector and a whispering gallery mode region according to some aspects of the present disclosure.

This is described with further reference to FIGS. 14 and 15.

FIG. 14 is a view schematically illustrating an arrangement relationship between a light reflector and a quasi-caustic region according to some aspects of the present disclosure. FIG. 15 is a view schematically illustrating an arrangement relationship between a light reflector and a whispering gallery mode region according to some aspects of the present disclosure.

As shown in FIG. 14, as the light emitting diode OD is formed in a regular hexagonal shape, similar to the case of the regular pentagonal structure of the third aspect, the quasi-caustic region QCA may be formed inside the light emitting diode OD.

Here, the maximum quasi-caustic region QCAm with the largest amount of total reflection waveguide light may be defined inside each linear portion IFL, and may have an isosceles triangle shape in which a base is substantially in contact with the corresponding linear portion IFL.

Reflecting the quasi-caustic region QCA, at least a portion of the arc-shaped light reflector OR of this aspect may be arranged to be located in the maximum quasi-caustic region QCAm.

Moreover, as shown in FIG. 15, since the light emitting diode OD is formed in the regular hexagon, as mentioned above, the waveguide light of the whispering gallery mode may be generated.

In this regard, for example, the waveguide light which is incident on and totally reflected by the linear portion IFL at an angle equal to half the interior angle of the regular hexagon may has a regular hexagonal total reflection path that continuously rotates along the total reflection interface IF, and may be trapped inside and dissipated.

The total reflection waveguide light of the whispering gallery mode corresponds to a part of the waveguide light forming the above-described quasi-caustic region QCA.

Accordingly, the whispering gallery mode region WGA, in which the path of the guide light of the whispering gallery mode is distributed, may be formed similarly to the quasi-caustic region QCA of FIG. 14.

In this regard, the whispering gallery mode region WGA may be located substantially within the quasi-caustic region QCA.

Here, the maximum whispering gallery mode region WGAm, in which the amount of total reflection waveguide light of the whispering gallery mode is greatest, may be defined inside each linear portion IFL, and may have an isosceles triangle shape in which a base is substantially in contact with the corresponding linear portion IFL.

Reflecting the whispering gallery mode region WGA, at least a portion of the arc-shaped light reflectors OR of this aspect may be arranged to be located in the maximum whispering gallery mode region WGAm.

Here, the maximum whispering gallery mode region WGAm and the maximum quasi-caustic region QCAm may be formed to mostly overlap each other except for some edges.

Thus, it may be seen that when the light reflector OR is located in the maximum quasi-caustic region QCAm, it is also substantially located in the maximum whispering gallery mode region WGAm.

As such, when the light reflector OR may be disposed in the whispering gallery mode region WGA, the waveguide light trapped inside the light emitting diode OD may be extracted to the outside, and light efficiency may be maximized.

Meanwhile, the light reflector OR may be arranged such that the convex direction of the arc of the light reflector OR is directed to the linear portion IFL of the total reflection interface IF adjacent to the light reflector OR.

Further, the plurality of light reflectors OR may be configured such that their orientation directions, for example, normal directions at centers of their arcs are different from each other. For example, the normal direction of the arc of the first light reflector OR1 and the second arc, and the normal direction of the arc of the second light reflector OR2 may not coincide with each other and may be different.

Meanwhile, similar to the above-described first to third embodiments, it is preferable that the arc-shaped light reflector OR has a sufficient curvature to implement a dispersion (or scattering) action for the waveguide light.

In this regard, the radius of the arc-shaped light reflector OR may have a size such that a circle having the radius is included inside the light emitting diode OD (or emission region).

<Fifth Non-Limiting Aspect>

Figure 16:
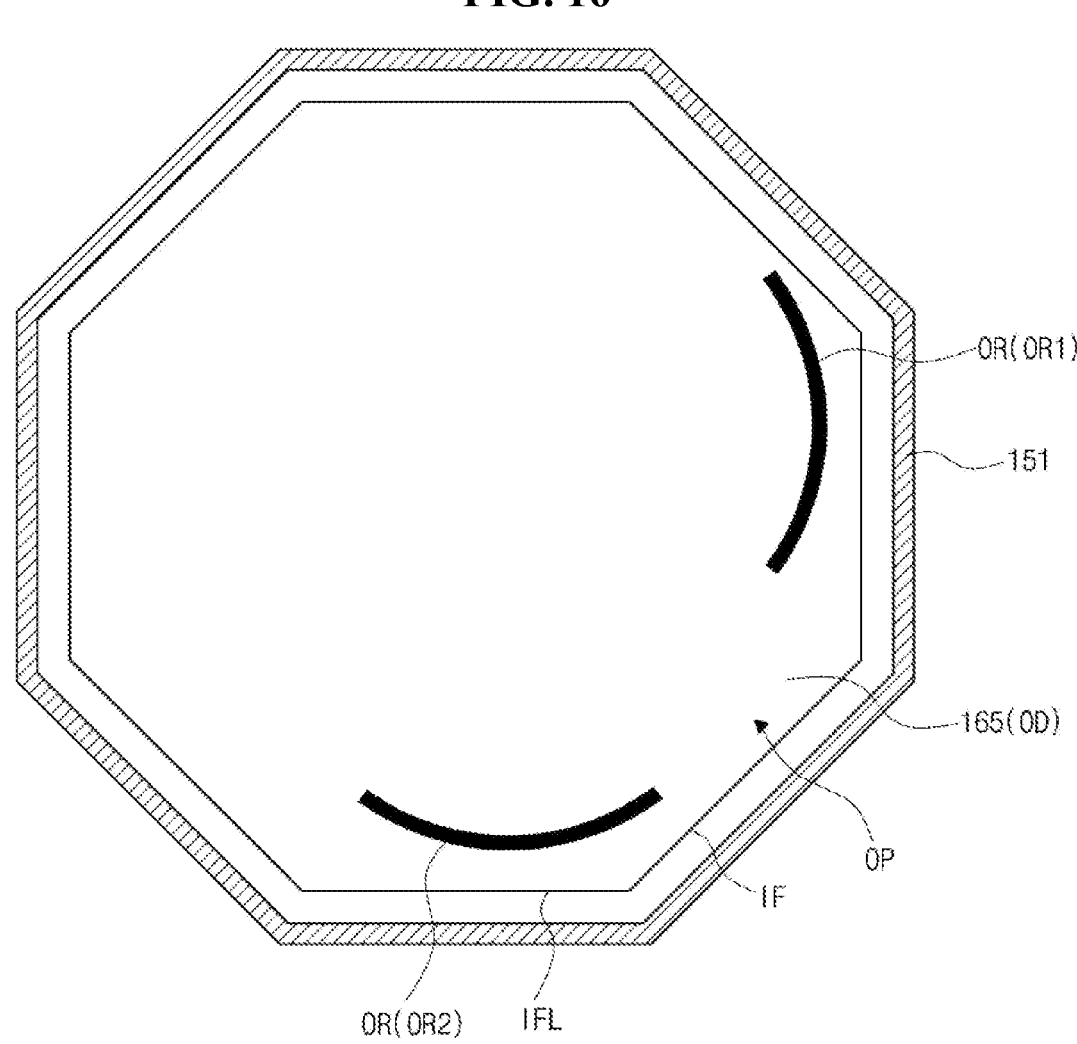
FIG. 16 is a plan view schematically illustrating a light extraction structure of a pixel region of a light emitting display device according to some aspects of the present disclosure.

FIG. 16 is a plan view schematically illustrating a light extraction structure of a pixel region of a light emitting display device according to some aspects of the present disclosure.

In the following description, detailed descriptions of components identical or similar to those of the first to fourth embodiments may be omitted.

Referring to FIG. 16, unlike the first to third embodiments, the pixel region P of this aspect may have a regular octagonal structure.

In this regard, for example, the opening OP and the light emitting diodes OD disposed therein may be formed in a regular octagonal shape in plan view. Also, the reflective portion 151 surrounding the opening OP and the light emitting diode OD may also have a regular octagonal shape in plan view which is a shape corresponding to the opening OP and the light emitting diode OD. More specifically, the reflective portion 151 may have a regular octagonal band shape in plan view.

Accordingly, the interface IF between the emission layer 165 of the regular octagonal light emitting diode OD and the bank (160 of FIG. 1) may have eight linear portions IFL forming a regular octagon.

As such, when the pixel region P is formed in a regular octagonal structure, due to its morphological characteristics, a waveguide light as light traveling in the horizontal direction may exist that is totally reflected at the interface IF between the emission layer 165 and the bank, more specifically, at linear portions IFL the interface IF one or more times, and propagates in the horizontal direction. This waveguide light may be lengthened in path by total reflection, thus may be absorbed by the medium and be dissipated, and thus an amount of light reaching the reflective portion 151 may be reduced.

Moreover, according to the morphological characteristics of the regular octagonal structure, the path of the guided light is regularly (or stably) distributed within the emission layer 165.

In addition, in the regular octagonal structure, similar to the third and fourth embodiments described above, a whispering gallery mode light may exist that is a waveguide light which is continuously totally reflected along the interface IF between the emission layer 165 and the bank to generate stable (or regular) light path (or light trajectory) inside the interface IF and thus trapped in the emission layer 165 without being output to an outside of the interface IF, and this waveguide light may be absorbed by a medium and dissipated.

In this regard, in this aspect, to maximize light efficiency by reducing the path of the waveguide light reflected on the linear interface IF between the regular octagonal emission layer 165 and the bank and by extracting the waveguide light of the whispering Gallery mode to the outside of the interface IF, the light reflector OR having the arc shape in plan view may be formed in the light emitting diode OD.

Accordingly, similar to the above-described first to fourth embodiments, the arc-shaped light reflector OR destroys the regular light path of the waveguide light in the emission layer 165 to disperse (or scatter) the light path. Thus, the path of the waveguide light is reduced and the amount of light absorbed by the medium is reduced, so that the amount of light reaching the reflective portion 151 may be increased. In addition, the whispering gallery mode waveguide light may be extracted toward the reflective portion 151. As a result, the light extraction efficiency may be maximized.

A light extraction structure in which the arc-shaped light reflector OR is applied to the regular octagonal pixel region P (or light emitting diode OD) is described in detail below.

In the light emitting display device of this aspect, the plurality of arc-shaped light reflectors OR may be formed inside the light emitting diode OD. Meanwhile, in this aspect, a case in which two light reflectors OR are disposed inside the light emitting diode (OD) is taken as an example.

As such, in this aspect, by forming the light reflector OR realizing the arc-shaped total reflection interface different from the linear total reflection interface IF inside the light emitting diode OD forming the linear total reflection interface IF with the bank, so that a simulated structure of a sinai billiard structure with chaotic dynamics may be implemented and thus the light extraction efficiency may be maximized.

It is preferable that the light reflector OR is disposed in a quasi-caustic region, more specifically, at least a portion of the light reflector OR is disposed in a maximum quasi-caustic region. In addition, it is preferable that the light reflector OR is disposed in a whispering gallery mode region which is a region in which waveguide light rotating in the whispering gallery mode is distributed.

Figure 17:
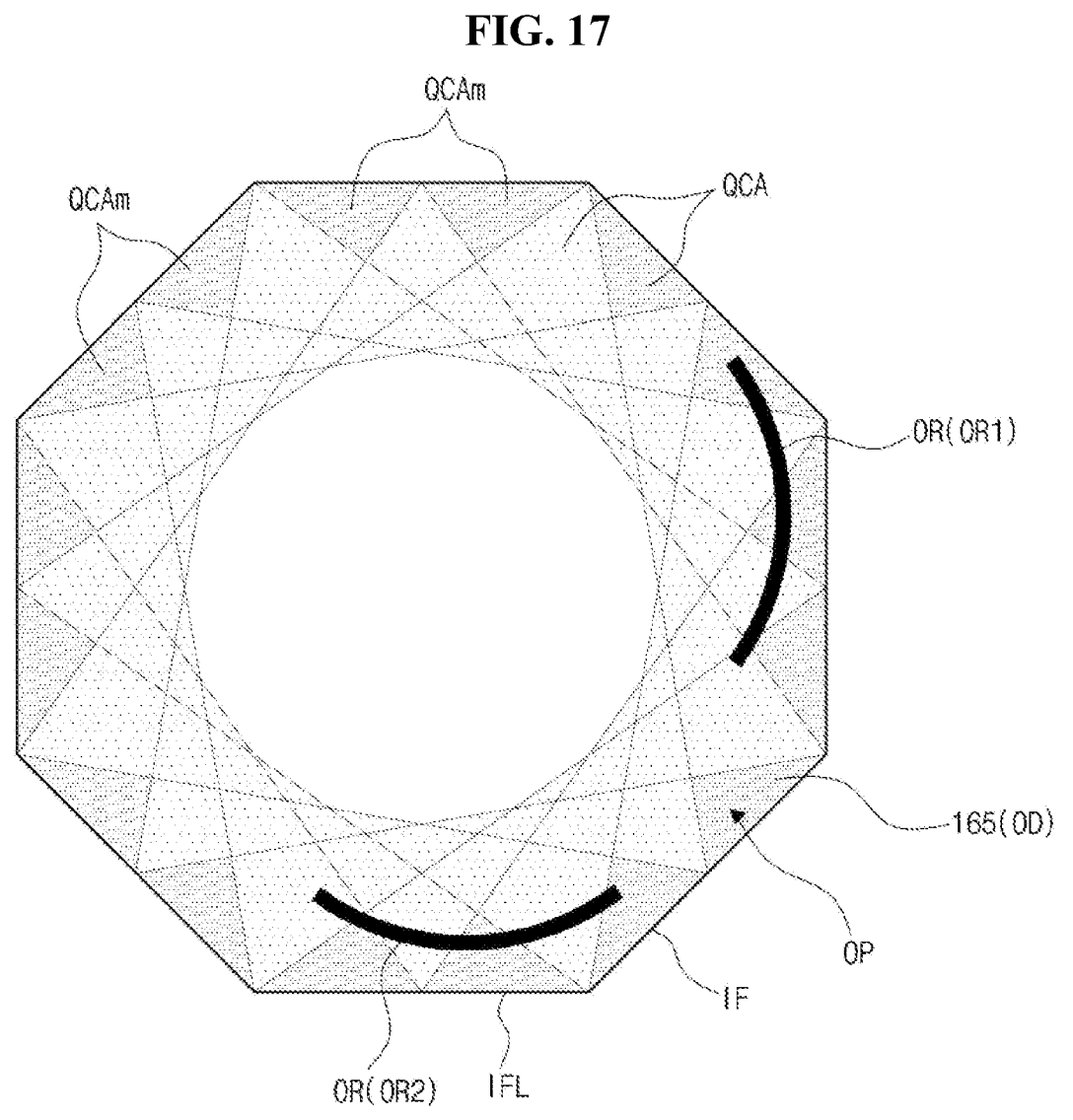
Figure 18:
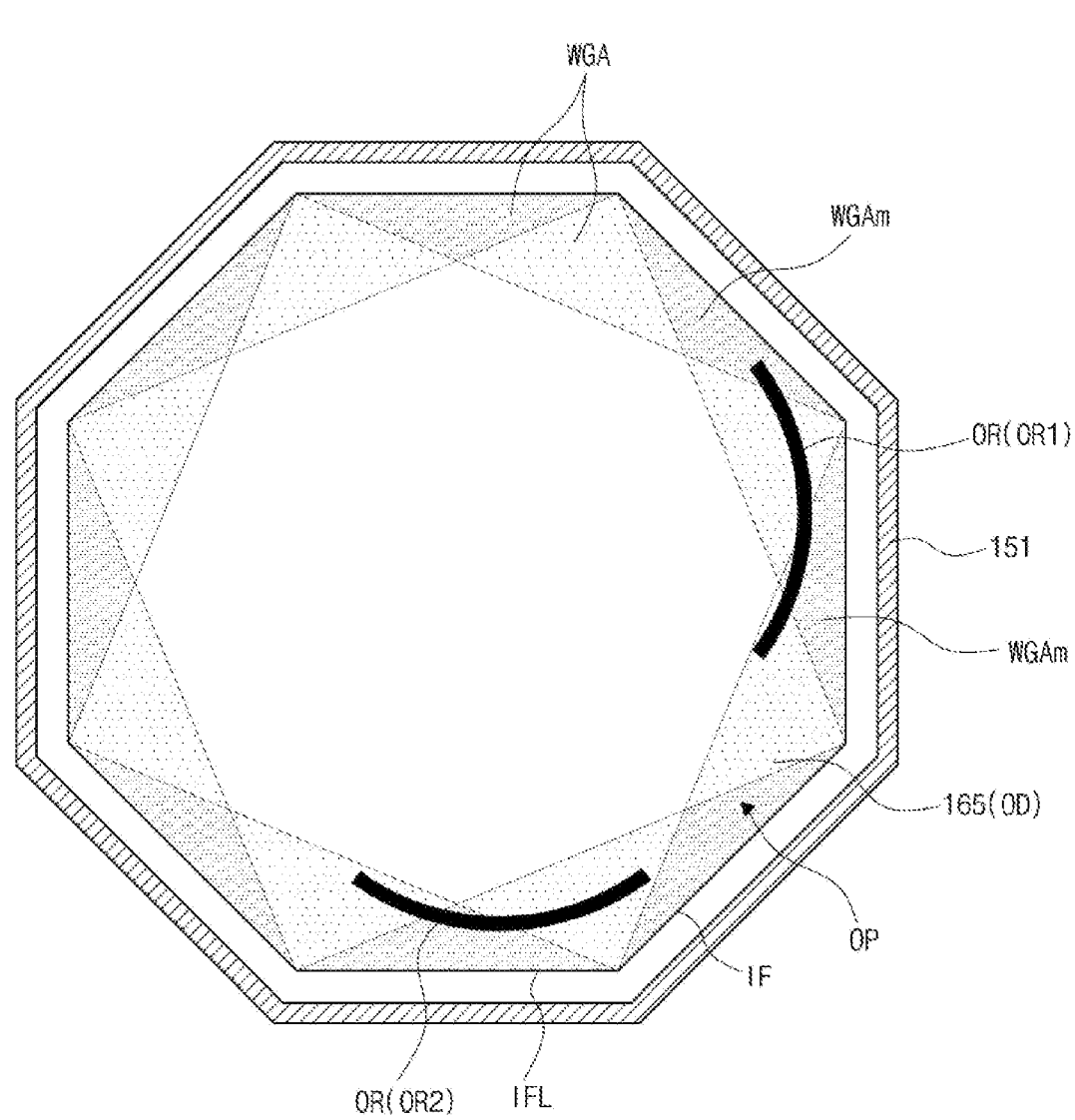
FIG. 18 is a view schematically illustrating an arrangement relationship between a light reflector and a whispering gallery mode region according to some aspects of the present disclosure.

This is described with further reference to FIGS. 17 and 18.

FIG. 17 is a view schematically illustrating an arrangement relationship between a light reflector and a quasi-caustic region according to some aspects of the present disclosure. FIG. 18 is a view schematically illustrating an arrangement relationship between a light reflector and a whispering gallery mode region according to some aspects of the present disclosure.

As shown in FIG. 17, as the light emitting diode OD is formed in a regular octagonal shape, similar to the case of the regular hexagonal structure of the fourth aspect, the quasi-caustic region QCA may be formed inside the light emitting diode OD.

Here, the maximum quasi-caustic region QCAm with the largest amount of total reflection waveguide light may be defined inside each linear portion IFL, and may have an isosceles triangle shape in which a base is substantially in contact with the corresponding linear portion IFL.

Reflecting the quasi-caustic region QCA, at least a portion of the arc-shaped light reflector OR of this aspect may be arranged to be located in the maximum quasi-caustic region QCAm.

Moreover, as shown in FIG. 18, since the light emitting diode OD is formed in the regular octagon, as mentioned above, the waveguide light of the whispering gallery mode may be generated.

In this regard, for example, the waveguide light which is incident on and totally reflected by the linear portion IFL at an angle equal to half the interior angle of the regular octagon may has a regular octagonal total reflection path that continuously rotates along the total reflection interface IF, and may be trapped inside and dissipated.

The total reflection waveguide light of the whispering gallery mode corresponds to a part of the waveguide light forming the above-described quasi-caustic region QCA.

Accordingly, the whispering gallery mode region WGA, in which the path of the guide light of the whispering gallery mode is distributed, may be formed similarly to the quasi-caustic region QCA of FIG. 17.

In this regard, the whispering gallery mode region WGA may be located substantially within the quasi-caustic region QCA.

Here, the maximum whispering gallery mode region WGAm, in which the amount of total reflection waveguide light of the whispering gallery mode is greatest, may be defined inside each linear portion IFL, and may have an isosceles triangle shape in which a base is substantially in contact with the corresponding linear portion IFL.

Reflecting the whispering gallery mode region WGA, at least a portion of the arc-shaped light reflectors OR of this aspect may be arranged to be located in the maximum whispering gallery mode region WGAm.

Here, the maximum whispering gallery mode region WGAm and the maximum quasi-caustic region QCAm may be formed to mostly overlap each other except for some edges.

Thus, it may be seen that when the light reflector OR is located in the maximum quasi-caustic region QCAm, it is also substantially located in the maximum whispering gallery mode region WGAm.

As such, when the light reflector OR may be disposed in the whispering gallery mode region WGA, the waveguide light trapped inside the light emitting diode OD may be extracted to the outside, and light efficiency may be maximized.

Meanwhile, the light reflector OR may be arranged such that the convex direction of the arc of the light reflector OR is directed to the linear portion IFL of the total reflection interface IF adjacent to the light reflector OR.

Further, the plurality of light reflectors OR may be configured such that their orientation directions, for example, normal directions at centers of their arcs are different from each other. For example, the normal direction of the arc of the first light reflector OR1 and the second arc, and the normal direction of the arc of the second light reflector OR2 may not coincide with each other and may be different.

Meanwhile, similar to the above-described first to fourth embodiments, it is preferable that the arc-shaped light reflector OR has a sufficient curvature to implement a dispersion (or scattering) action for the waveguide light.

In this regard, the radius of the arc-shaped light reflector OR may have a size such that a circle having the radius is included inside the light emitting diode OD (or emission region).

<Sixth Non-Limiting Aspect>

Figure 19:
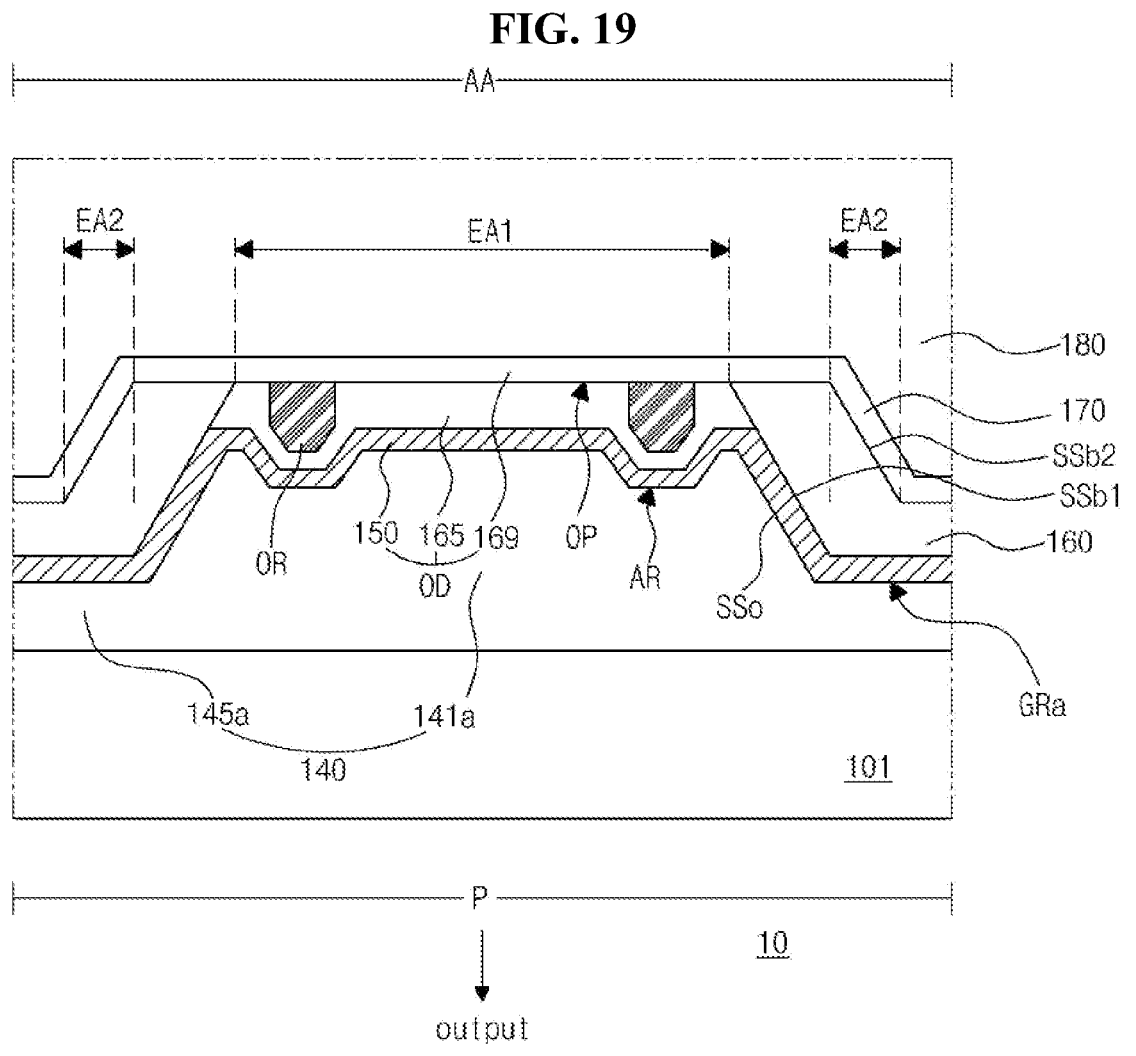

FIG. 19 is a schematic cross-sectional view illustrating a cross-sectional structure of a light emitting display device according to some aspects of the present disclosure.

In the following description, detailed explanations of components identical or similar to those of the first to fifth embodiments described above may be omitted.

In FIG. 19, for convenience of description, one pixel region P is shown, and components between the substrate 101 and the overcoat layer 140 are omitted.

Referring to FIG. 19, the light emitting display device 10 of this aspect may be configured in a bottom emission type, unlike the first to fifth embodiments described above.

According to the configuration of the bottom emission type, a structure of the overcoat layer 140, the light emitting diode OD, and the reflective portion 170 may be different from the structures of the first to fifth embodiments described above.

In this regard, for example, the overcoat layer 140 may include a protruding portion 141*a* corresponding to the first emission region EA1 of the pixel region P and a concave groove GRa formed along the boundary of the pixel region P. As such, the arrangement relationship between the protruding portion 141*a* and the concave groove GRa of the overcoat layer 140 may be substantially opposite to that in the first to fifth embodiments.

A portion of the overcoat layer 140 located below the concave groove GRa may have an upper surface which is substantially flat, and may be referred to as a flat portion (or base portion) 145*a*.

In addition, the protruding portion 141*a* may be configured to have a tapered shape in which a width narrows in an upward direction opposite to a direction in which light is emitted. In other words, the protruding portion 141*a* may be configured to have a tapered shape in which a width widens in a downward direction which is a direction in which light is emitted.

Accordingly, the protruding portion 141*a* may be configured with a side surface SSo as an inclined surface SSo.

Meanwhile, in the protruding portion 141*a* of the overcoat layer 140, an accommodation groove AG recessed toward the substrate 101 may be formed as a groove in which the light reflector OR is disposed (or inserted).

On the overcoat layer 140, the first electrode 150 may be formed separately in each pixel region P.

In this regard, the first electrodes 150 may be positioned to correspond to each protruding portion 141*a* of the overcoat layer 140, and may have a structure separated from the first electrode 150 of a neighboring pixel region P with the concave groove GRa interposed therebetween.

The first electrode 150 may be formed of a transparent electrode having a transparent property, and in this case, may be formed of a transparent conductive material such as ITO.

Meanwhile, in a case of realizing a micro cavity effect in a vertical direction, the first electrode 150 may be configured to include a semi-transparent electrode layer having a semi-transparent property, and may have a multi-layered structure including the semi-transparent electrode layer. The semi-transparent electrode layer of the first electrode 150 may be formed of, but not limited to, for example, a metal material such as magnesium (Mg), silver (Ag), or an alloy (MgAg) of magnesium (Mg) and silver (Ag), and such the metal material may be formed with a thickness thin enough to realize semi-transparent property.

The first electrode 150 may be formed along the surface of the protruding portion 141*a* of the overcoat layer 140, so that the first electrode may be formed in the accommodation groove AR of the protruding portion 141*a*.

The emission layer 165 may be formed on the first electrode 150. In this aspect, for convenience of description, a case in which the emission layer 165 is formed corresponding to the first emission region EA1 is taken as an example.

Since the emission layer 165 is formed along the surface of the first electrode 150, the emission layer 165 may be formed in the accommodation groove AR of the protruding portion 141*a*.

The bank 160 covering the edge of the first electrode 150 may be formed on the substrate 101 having the emission layer 165. The bank 160 may be disposed along the boundary of the pixel region P, cover an edge portion of the first electrode 150 and fill the concave groove GRa of the overcoat layer 140.

The bank 160 may have an opening OP therein exposing the emission layer 165 of each pixel region P.

The bank 160 may be formed in substantially the same shape as (or a shape corresponding to) the overcoat layer 140.

In this regard, the bank 160 may be configured to have a tapered shape with a width being narrower in a downward direction. The tapered shape of the bank 160 may be the same as that of the concave groove GRa of the overcoat layer 140 positioned there below.

Accordingly, the bank 160 may be configured such that an inner side surface SSb1 and an outer side surface SSb2 as side surfaces thereof are formed of inclined surfaces SSb1 and SSb2. The inner and outer inclined surfaces SSb1 and SSb2 of the bank 160 may have substantially the same inclination angle as the inclined surface SSo of the protruding portion 141*a* located there below.

The inner inclined surface SSb1 of the bank 160 may surround the opening OP. Accordingly, it may be seen that the opening OP has an inclined side surface corresponding to the inner inclined surface SSb1.

The second electrode 169 may be formed on the emission layer 165 and the bank 160 and over the entire surface of the substrate 101.

The second electrode 169 may include a metal material with high reflectance. For example, the second electrode 169 may include Al, Ag. Ti, or an Al—Pd—Cu (APC) alloy, but is not limited thereto.

Meanwhile, the second electrode 169 may have a single-layered structure or a multi-layered structure. When formed in a multi-layered structure, for example, the second electrode 169 may have a laminated structure of Al and Ti (e.g., Ti/Al/Ti), a laminated structure of Al and ITO (e.g., ITO/Al/ITO), a laminated structure of an APC alloy and ITO (e.g., ITO/APC/ITO), etc., but is not limited thereto.

The second electrode 169 may include a reflective portion (or inclined portion) 170 formed along the outer inclined surface SSb2 of the bank 160.

A region where the reflective portion 170 of the second electrode 169 is disposed may be a so-called reflective emission region in which light generated in the emission layer 165 located inside the region and then propagated in the lateral direction is reflected and emitted downward, and this region may be referred to as the second emission region EA2.

The encapsulation layer 180 may be formed on the second electrode 169. The encapsulation layer 180 may serve to prevent oxygen or moisture from permeating into the light emitting diode OD.

Meanwhile, although not specifically shown, between the substrate 101 and the overcoat layer 140, a thin film transistor (T of FIG. 1) connected to the first electrode 150 through a contact hole, and a color filter layer (195 of FIG. 1) may be disposed.

In the light emitting display device 10 of this aspect configured as described above, the pixel region P may be formed in a square shape, a rectangle shape, a regular pentagon shape, a regular hexagon shape, or a regular octagon shape in plan view as in any one of the first to fifth exemplary embodiments.

The light reflector OR may be configured to protrude in a downward direction from the lower surface of the second electrode 169 toward the substrate 101 according to the structure of the bottom emission type light emitting diode OD.

In this regard, for example, the light reflector OR may be formed such that its upper surface contacts the lower surface of the second electrode 169 and the light reflector OR is inserted (or accommodated) into the accommodation groove AR.

Accordingly, within the accommodating groove AR, the light reflector OR may be formed such that its side surface and lower surface contact the emission layer 165 (or be surrounded by the emission layer 165).

The light reflector AR may be formed of the same material and in the same process as the bank 160. As another example, the light reflector OR may be formed in a process different from that of the bank 160, and in this case, the light reflector OR may be formed of the same material as the bank layer 160 or a different material from the bank 160.

In addition, the light reflector OR has a refractive index lower than that of the emission layer 165 and may have a refractive index equal to or smaller than that of the bank 160.

In order for the light reflector OR to destroy the path of the waveguide light along the circular total reflection interface between the light emitting layer 165 and the bank 160, as in the first aspect described above, at least a portion of the light reflector OR may be located in the caustic region (CA of FIGS. 3 and 4) which is a total reflection optical path region made by the circular total reflection interface.

Similar to the above-described first to fifth embodiments, to realize chaotic dynamics, the light reflector OR may be disposed inside the light emitting diode OD.

Accordingly, the path of the waveguide light is sharply changed, thereby maximizing the light extraction efficiency.

Meanwhile, in the above-described embodiments of the present disclosure, square, rectangular, regular pentagonal, regular hexagonal, and regular octagonal structures are described as examples of n-gonal structures (n is a natural number of 4 or more). However, even to other polygons, the light reflector may be applied to implement a chaotic dynamics structure.

As described above, according to the embodiments of the present disclosure, inside the light emitting diode of polygonal structure forming the linear total reflection interface with the bank, the low refractive light reflector realizing the arc-shaped total reflection interface different from the linear total reflection interface may be formed.

Accordingly, in the light emitting diode, the chaotic dynamics structure may be implemented in which the linear total reflection interface and the arc-shaped total reflection interface inside the linear total reflection interface are combined to make the motion trajectory of light in a chaotic state.

Accordingly, the stable path of the waveguide light along the linear total reflection interface is destroyed to disperse the light path, thereby making the path of the waveguide light unstable.

Therefore, the path of the waveguide light is sharply changed and its length is reduced, thus the amount of light absorbed by the medium is minimized and the amount of light reaching the reflective portion is maximized, so that the light extraction efficiency may be maximized.

In addition, with respect to the polygonal structure in which the waveguide light of the whispering gallery mode is generated, the incident angle of the waveguide light is sharply changed to less than the total reflection critical angle of the linear total reflection interface, thus the waveguide light may be extracted to the outside of the light emitting diode and utilized, so that the light extraction efficiency may be maximized.

Moreover, as described above, the light emitting display device according to the present embodiments may have the improved light extraction efficiency, so that power consumption may be reduced and thus the light emitting display device may be driven with low power.

It will be apparent to those skilled in the art that various modifications and variation may be made in the present disclosure without departing from the spirit or scope of the disclosure. Thus, it is intended that the present disclosure cover the modifications and variations of this disclosure provided they come within the scope of the appended claims and their equivalents.

Claim language or other language reciting "at least one of" a set and/or "one or more" of a set indicates that one member of the set or multiple members of the set (in any combination) satisfy the claim. For example, claim language reciting "at least one of A and B" or "at least one of A or B" means A, B, or A and B. In another example, claim language reciting "at least one of A, B, and C" or "at least one of A, B, or C" means A, B, C, or A and B, or A and C, or B and C, or A and B and C. The language "at least one of" a set and/or "one or more" of a set does not limit the set to the items listed in the set. For example, claim language reciting "at least one of A and B" or "at least one of A or B" can mean A, B, or A and B, and can additionally include items not listed in the set of A and B.

What is claimed is:

1. A light emitting display device, comprising:
a plurality of subpixels on a substrate, each of the plurality of subpixels having a corresponding emission region, each of the plurality of subpixels having an outer interface with an n-gonal shape;
a light emitting diode at each corresponding emission region and including an emission layer; and
a plurality of arc-shaped light reflectors inside the light emitting diode and having a lower refractive index than a refractive index of the emission layer,
wherein the plurality of arc-shaped light reflectors are in a quasi-caustic region of the outer interface.

2. The light emitting display device of claim 1, wherein the light emitting display device is a top-emission device, and further comprises:
a bank on the substrate having a corresponding opening for each of the plurality of subpixels.

3. The light emitting display device of claim 1, wherein at least a number of the arc-shaped light reflectors are disposed in a region having a highest total reflection optical path distribution in the quasi-caustic region.

4. The light emitting display device of claim 1, wherein a radius of a circle formed by the plurality of arc-shaped light reflectors is smaller than a radius of the emission region.

5. The light emitting display device of claim 1, wherein the plurality of arc-shaped light reflectors are positioned asymmetrically relative to each other in the mission region.

6. The light emitting display device of claim 1, wherein a height of each of the plurality of arc-shaped light reflectors is equal to or greater than a height of the emission layer.

7. The light emitting display device of claim 1, wherein a height of each of the plurality of arc-shaped light reflectors is smaller than a height of an inclined surface of each of the plurality of subpixels.

8. The light emitting display device of claim 5, wherein each of the plurality of arc-shaped light reflectors has a lower portion having a rectangular shape and an upper portion having a trapezoid shape.

9. The light emitting display device of claim 8, wherein a height of the rectangular portion is larger than a height of the trapezoid portion.

10. A light emitting display device comprising:
a substrate;

a transistor on the substrate;
a subpixel electrically connected to the transistor, the subpixel including an organic light emitting diode; and
a plurality of light reflectors inside the organic light emitting diode;
wherein the subpixel has an n-gonal shape and the plurality of light reflectors have an arc shape.

11. The light emitting display device of claim 10, wherein the subpixel has at least two emissions areas each having the n-gonal shape.

12. The light emitting display device of claim 10, wherein the subpixel has a rectangular shape,
wherein the plurality of light reflectors includes a first light reflector and a second light reflector staggered in a long axis direction of the rectangular shape, and
wherein a center of the first light reflector has different arc line than a center of the second light reflector.

13. The light emitting display device of claim 1, wherein the n-gonal shape has more than 5 sides, and
wherein at least a number of the plurality of light reflectors are in a quasi-caustic region of the subpixel.

14. The light emitting display device of claim 13, wherein the number of the plurality of light reflectors are in an area within the quasi-caustic region having a maximum distribution of total reflection optical path.

15. The light emitting display device of claim 10, further comprising:
an inclined reflective portion within an emission area of the subpixel, wherein the inclined reflective portion has a shape corresponding to a shape of the subpixel.

16. The light emitting display device of claim 15, wherein the shape of the subpixel is one of a rectangular shape or a shape having more than 5 sides.

17. The light emitting display device of claim 15, wherein the inclined reflective portion extends from a first electrode of the subpixel.

18. The light emitting display device of claim 15, wherein the inclined reflective portion extends from a second electrode of the subpixel.

19. The light emitting display device of claim 10, wherein each of the plurality of light reflectors has a lower portion having a rectangular shape and an upper portion having a trapezoid shape.

20. The light emitting display device of claim 19, wherein a height of the rectangular portion is larger than a height of the trapezoid portion.

* * * * *